United States Patent
Zeng et al.

(10) Patent No.: US 12,057,482 B2
(45) Date of Patent: Aug. 6, 2024

(54) MOSFET WITH DISTRIBUTED DOPED P-SHIELD ZONES UNDER TRENCHES

(71) Applicant: MaxPower Semiconductor, Inc., San Jose, CA (US)

(72) Inventors: Jun Zeng, Rodondo Beach, CA (US); Mohamed N. Darwish, Campbell, CA (US); Shih-Tzung Su, Shulin (TW)

(73) Assignee: MaxPower Semiconductor, Inc., San Jose, CA (US)

( * ) Notice: Subject to any disclaimer, the term of this patent is extended or adjusted under 35 U.S.C. 154(b) by 463 days.

(21) Appl. No.: 17/395,239

(22) Filed: Aug. 5, 2021

(65) Prior Publication Data

US 2022/0052170 A1    Feb. 17, 2022

Related U.S. Application Data

(60) Provisional application No. 63/064,343, filed on Aug. 11, 2020.

(51) Int. Cl.
*H01L 29/423*     (2006.01)
*H01L 23/60*      (2006.01)
*H01L 29/66*      (2006.01)
*H01L 29/78*      (2006.01)

(52) U.S. Cl.
CPC .......... *H01L 29/4236* (2013.01); *H01L 23/60* (2013.01); *H01L 29/66719* (2013.01); *H01L 29/66734* (2013.01); *H01L 29/7813* (2013.01)

(58) Field of Classification Search
CPC .......... H01L 29/4236; H01L 29/66719; H01L 29/66734; H01L 29/7813; H01L 23/60

USPC .......................................................... 257/213
See application file for complete search history.

(56) References Cited

U.S. PATENT DOCUMENTS

| | | | |
|---|---|---|---|
| 8,076,719 B2 | 12/2011 | Zeng et al. | |
| 8,466,025 B2 | 6/2013 | Zeng et al. | |
| 8,809,948 B1* | 8/2014 | Yilmaz | H01L 29/7811 257/334 |
| 2014/0175540 A1* | 6/2014 | Bobde | H01L 29/66719 257/334 |

* cited by examiner

*Primary Examiner* — Igwe U Anya
(74) *Attorney, Agent, or Firm* — Patent Law Group; Brian Ogonowsky

(57) ABSTRACT

A vertical trench MOSFET is formed with deep P-shield regions below portions of each gate trench. The deep P-shield regions are effectively downward extensions of the P-body/well, and are electrically coupled to the top source electrode. The P-shield regions abut the bottom portions and lower sides of the gate trenches, so that those small portions of the gate trench do not create N-channels and do not conduct current. Accordingly, each trench comprises an active gate portion that creates an N-channel and a small non-active portion that abuts the P-shield regions. The spacing of the P-shield regions along each gate trench is selected to achieve the desired electric field spreading to protect the gate oxide from punch-through. No field plate trenches are needed to be formed in the active area of the MOSFET. The deep P-shield regions are formed by implanting P-type dopants through the bottom of the trenches.

27 Claims, 22 Drawing Sheets

MOSFET WITH DISTRIBUTED DOPED P-SHIELD ZONES UNDER TRENCHES

CROSS REFERENCE TO RELATED APPLICATIONS

This application claims priority from U.S. provisional application Ser. No. 63/064,343, filed Aug. 11, 2020, by Jun Zeng et al., incorporated herein by reference.

FIELD OF INVENTION

The present invention relates to a trench power semiconductor device, such as a vertical MOSFET or an IGBT, and more particularly, to a trench power semiconductor device with distributed doped shield zones under the trenches to improve ruggedness and switching characteristics of the device.

BACKGROUND

Power MOSFETs are widely used as switching devices in many electronic applications for power management and switching control. For minimizing the total power loss while retaining a wide safe operation area (SOA), it is desired that power MOSFETs have low specific on-resistance (Rsp), low gate charges (including the gate-to-drain "Miller" charge Qgd and the total gate charge Qg), as well as high ruggedness, such as unclamped inductive switching and short circuit duration capabilities.

Vertical power MOSFET structures with a Recessed Shielded Field Plate (RSFP), comprising P-shield compensation regions, provide lower Rsp, lower total gate charge (Qg), and a lower "Miller" charge (Qgd). Prior art FIG. 1 is a cross-sectional view of a vertical trench MOSFET that uses a RSFP. FIG. 1 is copied from FIG. 4a of U.S. Pat. No. 8,076,719. The same figure is shown in U.S. Pat. No. 8,466,025, both patents being hereby incorporated by reference.

The RSFP MOSFET structure of FIG. 1 uses an array of cells comprising many parallel linear trenches. The cells include an insulated trench 12, lined with a gate oxide 14 and containing a conductive doped polysilicon gate 16.

When the MOSFET gate 16 and the metal source electrode 18 are biased at ground potential with a positive voltage applied to the N++ substrate 20 (via a bottom metal drain electrode), the device does not conduct current, since the gate voltage is below a threshold voltage and the vertical PN junction is reverse biased. If the gate 16 is biased sufficiently positive, the P-body 22 adjacent the trench 12 inverts to create a conductive N-channel, and current flows vertically between the electrodes.

When the device is off, a depletion region extends into the N-drift layer 24. It is desirable that the depletion region is spread out uniformly so there is a relatively low electric field between the gate and the N-drift layer 24 under the gate trench 12. This prevents damage to the gate oxide 14.

To make the depletion region more uniform and lower the electric field under the gate trench 12, insulated trenches are formed on both side of the gate trench 12 that contain doped polysilicon electrodes (field plates 28 or RFP electrodes), which are connected to the source electrode 18. These trenched regions are referred to as field plate trenches 26. These field plates 28 are also capacitively coupled to the P-body 22 and N-drift layer 24.

Below the field plates 28 are P-type shield regions 30, which are floating and capacitively coupled to the field plates 28 or directly shorted to the field plates 28. The operation of field plates and shield regions is well known and their effect is to spread out the depletion region to reduce the electric field near the gate trenches for the purpose of increasing the breakdown voltage.

FIG. 2 is a top down view of the various regions, gate trench 12, and field plate trenches 26 (or recessed field plates (RFPs)). The N+ source regions 32 and P+ body contact regions 34 contact the source electrode 18. The trenches 12 and 26 are formed as parallel strips.

As seen in the single cell area of the MOSFET, there are two field plate trenches 26 and one gate trench 12, where current only flows along the sides of the gate trench 12. As such, the resulting density of the gate trenches 12 and the pitch of the gate trenches 12 are limited by the RFPs (or RSFPs). This reduces the maximum overall current that can be conducted by the MOSFET and increases the on-resistance, given a particular die size.

Furthermore, a tight process alignment between the field plate trenches 26 and the implanted P-type shield regions 30 is required for achieving good parametric distributions, including the on-resistance, threshold voltage, breakdown voltage, etc.

Therefore, it would be desirable provide an improved device structure and a corresponding fabrication process that do not incur these drawbacks.

SUMMARY

In one embodiment, a vertical trench MOSFET is formed where some or all of the recessed field plates are replaced by gate electrodes, and deep P-shield regions are formed orthogonally (i.e., perpendicular to the trench strips) and below portions of each trench. The deep P-shield regions are effectively downward extensions of the P-body/well, and are electrically connected to the top source electrode. The P-shield regions abut the bottom portions and lower sides of the gate trenches, so that those portions of the gate trench do not create N-channels and do not conduct current. However, this is only a small portion of the total gate trench area, and there is relatively little reduction in the maximum current that can be conducted by the MOSFET. Assuming the gate trenches are linear and formed as parallel strips, the P-shield regions are only formed under a small portion of each gate trench strip. It is preferred that the length of the P-shield region under a trench is less than the spacing between P-shield regions. Accordingly, each gate trench comprises an active gate portion that creates an N-channel and a small non-active portion that abuts the P-shield regions.

The spacing of the P-shield regions along each gate trench is optimized to achieve the desired electric field spreading to protect the gate oxide from punch-through and improve ruggedness.

In one embodiment, all the RFP electrodes are replaced by gate electrodes. Therefore, no field plate trenches are formed in the active area of the MOSFET, which maximizes gate current conduction.

The deep P-shield regions are formed by implanting P-type dopants through the bottom of the trenches while also doping the P-body/well through the top surface of the semiconductor wafer. So the P-shield regions are self-aligned with the trenches. No special alignment is needed.

The small increase in on-resistance due to the non-active portions of the gate trench is much less than in FIG. 1 where entire trenches are used for the RFPs. Therefore, there can be a high density of gate trenches with only a very small area being made inactive due to the P-shield regions.

In another embodiment, there are RFP electrodes (field plates) in parallel with the gate electrodes. The ratio between gate electrodes and RFP electrodes is used to optimize the trade-off between specific on-resistance Rsp and other device parameters such as ruggedness, capacitances, etc.

Other embodiments are disclosed.

BRIEF DESCRIPTION OF DRAWINGS

FIG. 1 is a cross-section of FIG. 2.

Elements that are the same or equivalent in the various figures are labeled with the same numeral.

DETAILED DESCRIPTION

Figure 3:
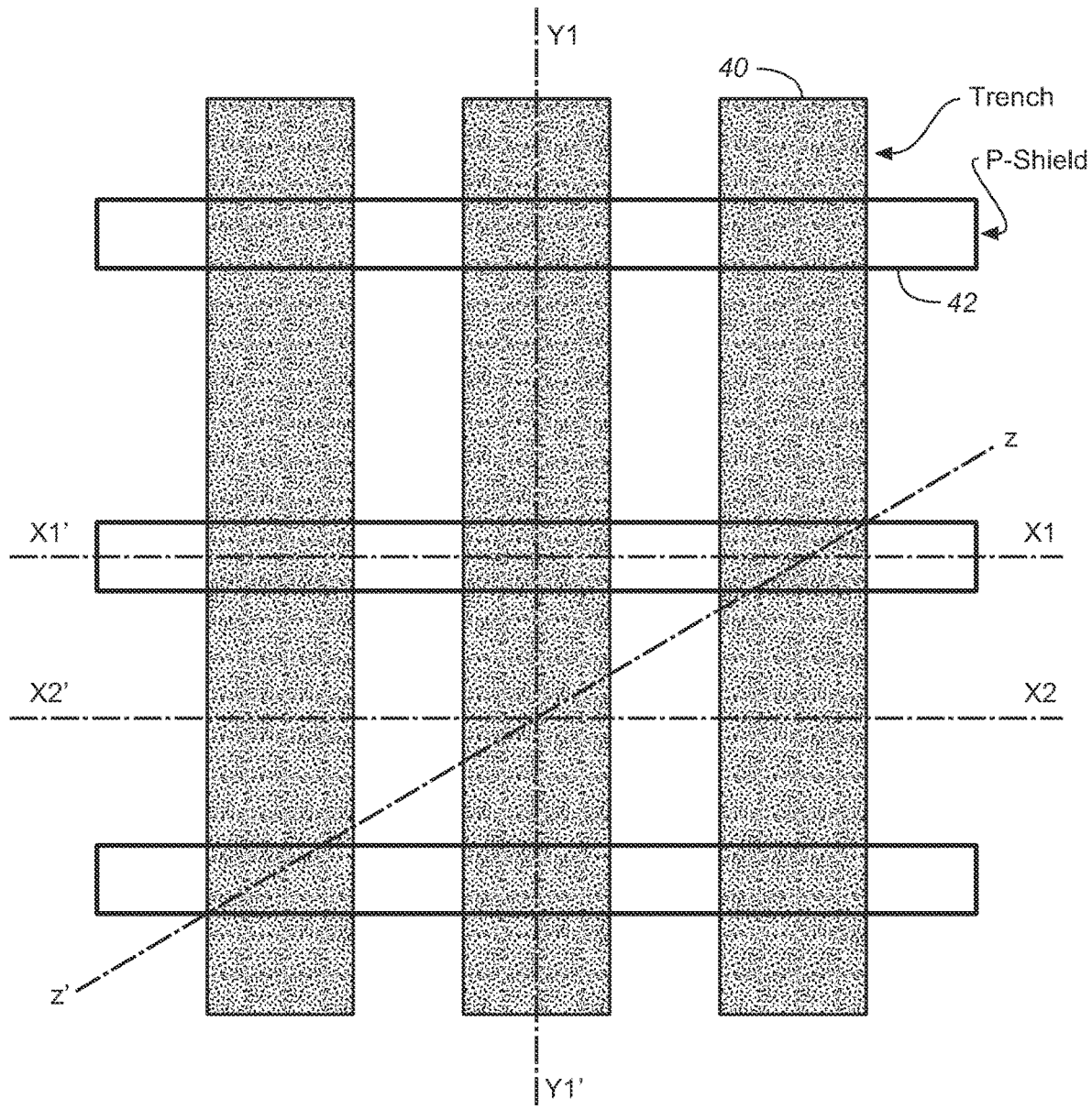
FIG. 3 is a top down view of a portion of a vertical MOSFET during fabrication, in accordance with one embodiment of the invention, where parallel gate trenches are shown along with an implant mask to orthogonally form deep P-shield regions below certain areas of the gate trenches.

FIG. 3 is a top down view of a portion of a vertical MOSFET during fabrication in accordance with one embodiment of the invention, where three parallel trenches 40 are shown along with implant mask openings 42 to form deep P-shield regions below certain areas of the trenches 40. The trenches 40 are etched in a conventional manner using reactive ion etching (RIE). The sizes of the trenches 40 depend on the desired parameters of the MOSFET and can be determined by simulation. The trenches 40 may be on the order of 0.3 microns wide, 1 micron deep, with a 1 micron pitch. FIG. 3 will be used to identify the orientations of the various cross-sections described below.

Figure 1:
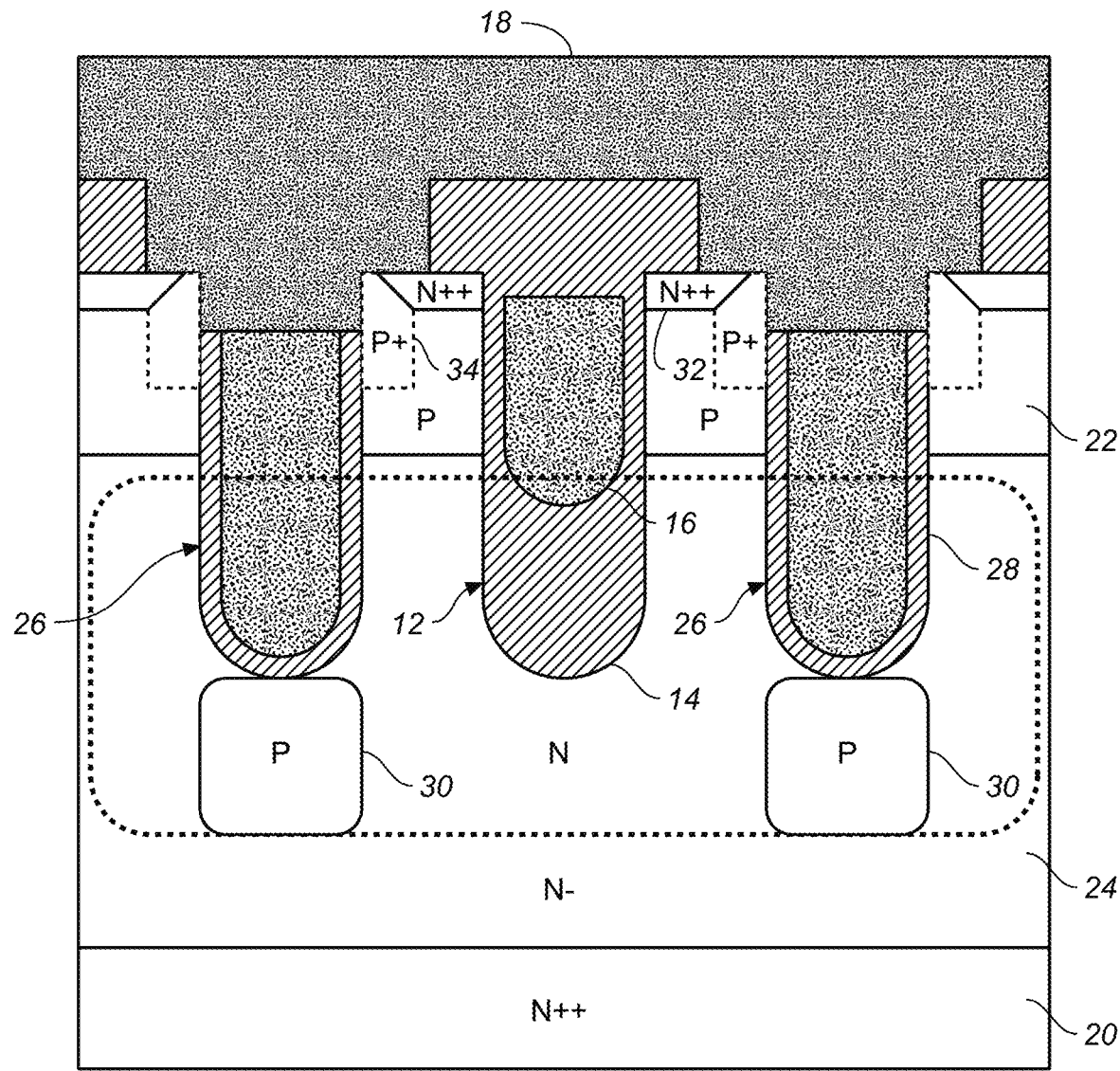
FIG. 1 is a cross-sectional view of a portion of a single cell in a prior art vertical MOSFET from U.S. Pat. No. 8,076,719, which utilizes a substantial amount of semiconductor non-conducting surface area to form Recessed Shield Field Plates (RSFPs).
Figure 2:
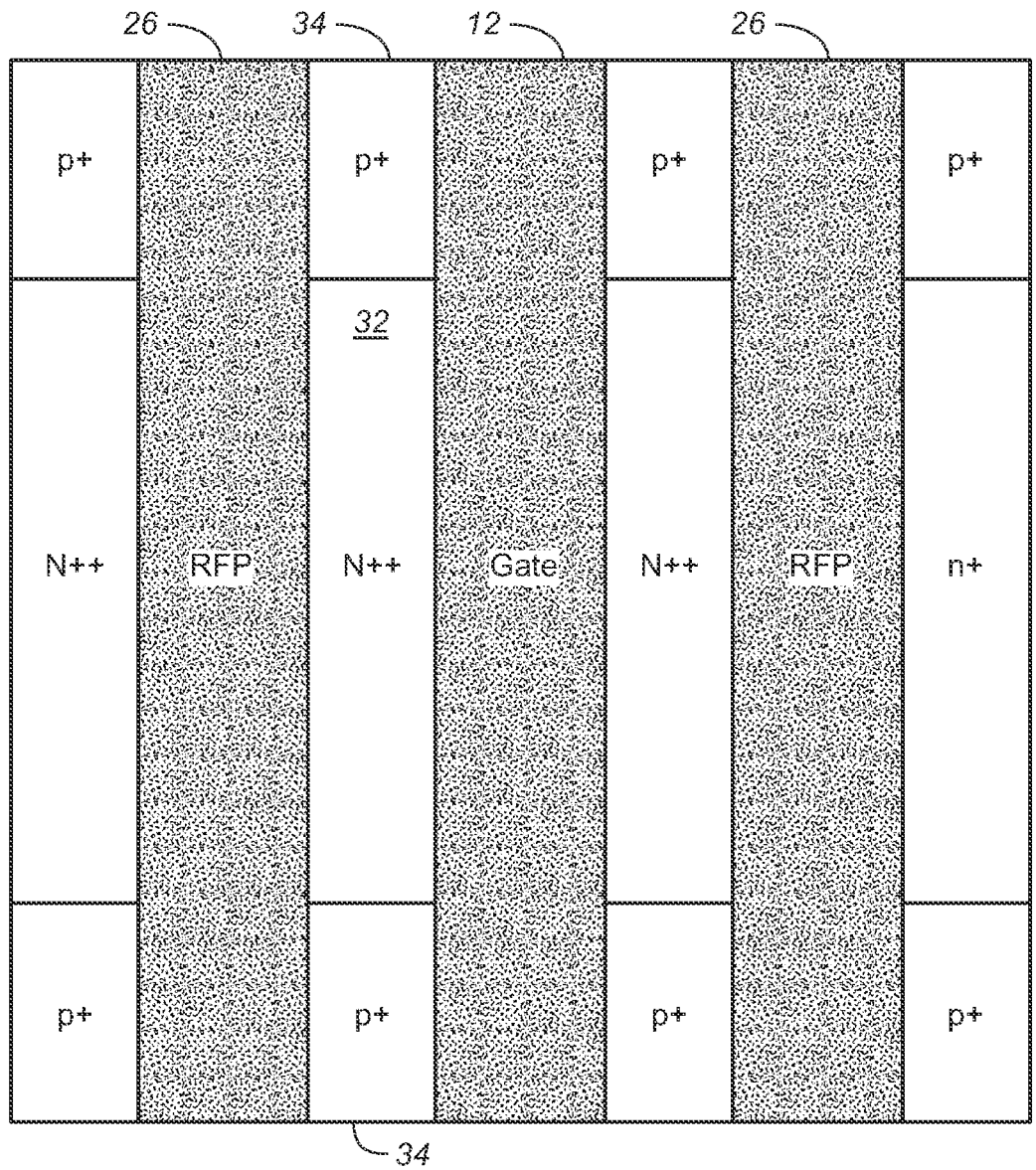
FIG. 2 is a top down view of a prior art single cell portion showing the gate trenches and field plate trenches formed as parallel strips.
Figure 4:
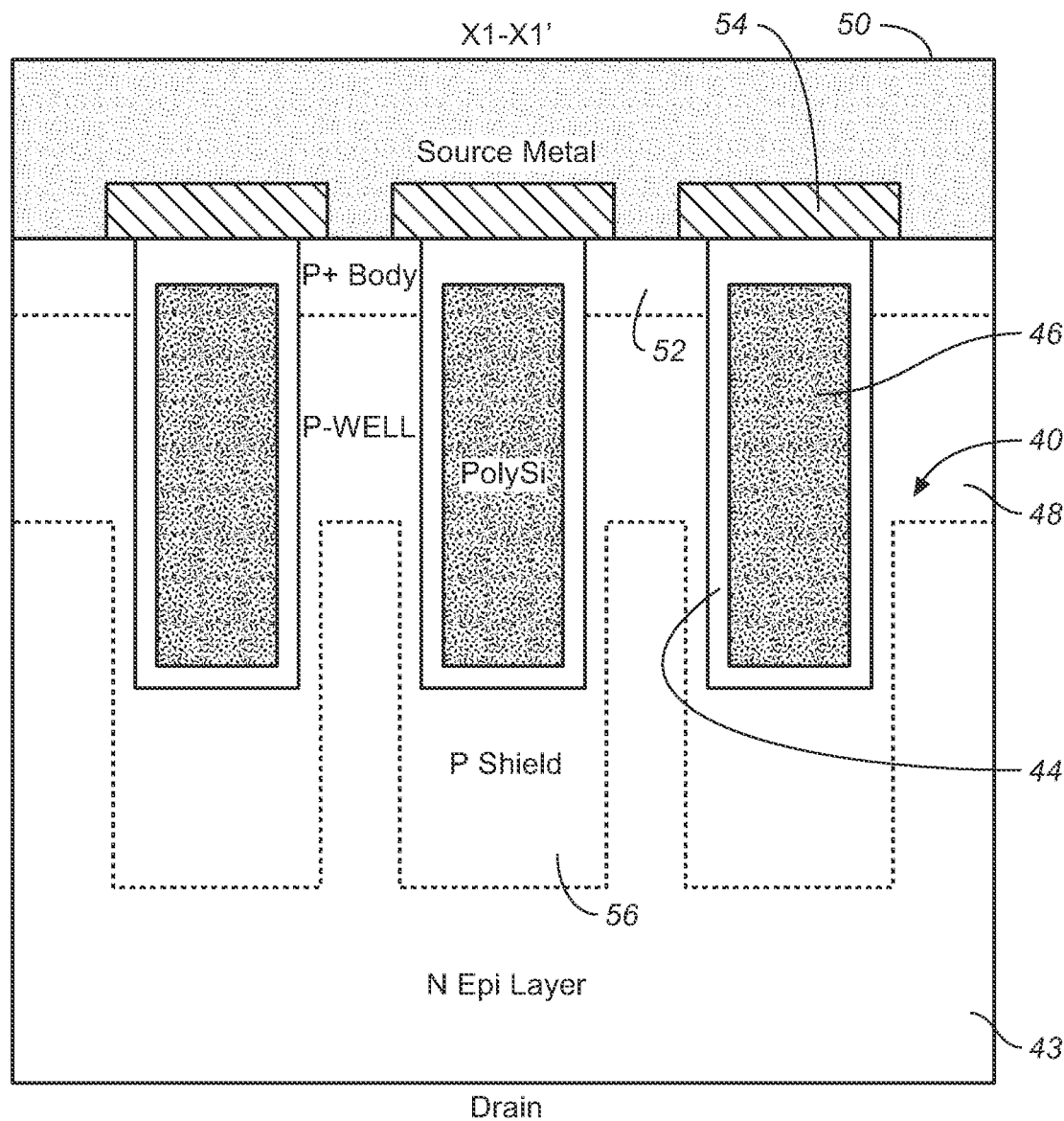
FIG. 4 is a cross-sectional view of the resulting MOSFET along line X1-X1' in FIG. 3, where the portions of the cells shown do not conduct current.

FIG. 4 is a cross-sectional view of the resulting MOSFET along line X1-X1' in FIG. 3, where the portions of the cells shown do not conduct current. In FIG. 4, an N-epi layer 43 (the drift region) is grown over an N+ substrate (not shown), which may be the same N++ substrate 20 shown in FIG. 1. A metal drain electrode (not shown) is formed on the bottom of the die.

The trenches 40 are oxidized to form gate oxide 44 on the sidewalls, and the insulated trenches 40 are partially filled with a conductive material such as doped polysilicon 46, or other conductive material, to form trenched gates. All the trenched gates are electrically connected together. The trenches 40 are formed in a P-well 48 (or body), and the P-well 48 is electrically contacted by a source electrode 50 via P+ body contact regions 52. The P-well 48 may be a continuous layer or may be a region within the N-epi layer 43.

A dielectric 54 (e.g., oxide) insulates the gates from the source electrode 50, and the gates are connected to a metal gate electrode outside the cross-section. Implanted deep P-shield regions 56 extend below the trenches 40 and also abut the trenches 40 on opposing sides, as shown in FIG. 3. Therefore, in the area shown in FIG. 4, when the gate is positively biased, there is no N-channel formed between the source and the N-epi layer 43. The deep P-shield regions 56 may have a dopant concentration higher than the P-well 48, lower than that of the P-well 48, or equal to that of the P-well 48. Additionally, the deep P-shield doping concentration can be adjusted to provide a charge balance (or so-called super junction) with the N-epi layer 43 (or the N-enhancement region 80 in FIG. 27).

Since the P-shield regions 56 are electrically connected to the source electrode voltage, the depletion region boundary (when the MOSFET is off) spreads deep into the N-epi layer 43, and the electric field across the gate oxide 44 is relatively low. Therefore, breakdown occurs away from the gate oxide 44, avoiding damage to the gate oxide 44, to improve the ruggedness.

Figure 5:
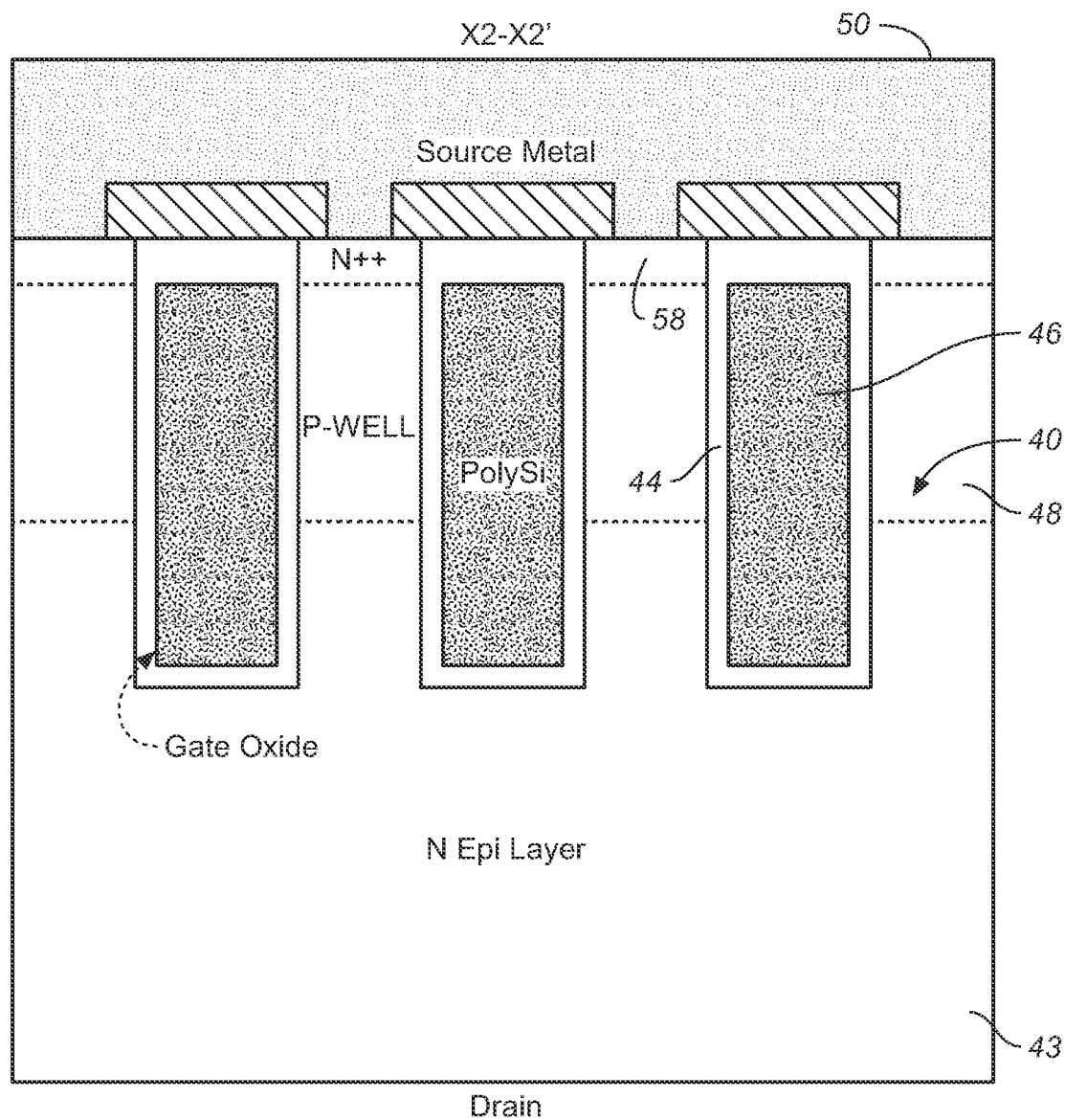
FIG. 5 is a cross-sectional view of the resulting MOSFET along line X2-X2' in FIG. 3, where the portions of the cells shown conduct current via N-channels along the gate trenches.

FIG. 5 is a cross-sectional view of the resulting MOSFET of FIG. 3 along line X2-X2' in FIG. 3, where the portions of the cells shown conduct current via N-channels along the gate trenches 40. There are no P-shield regions in the cross-section of FIG. 5. The N+ source regions 58 are connected to the source electrode 50. In areas where there are no P-shield regions 56, when the MOSFET is positively biased and a gate voltage above the threshold is applied, the P-well 48 along the gate trenches 40 inverts to form a conductive N-channel between the N+ source regions 58 and the N-epi layer 43 to conduct a vertical current between the two electrodes.

Figure 6:
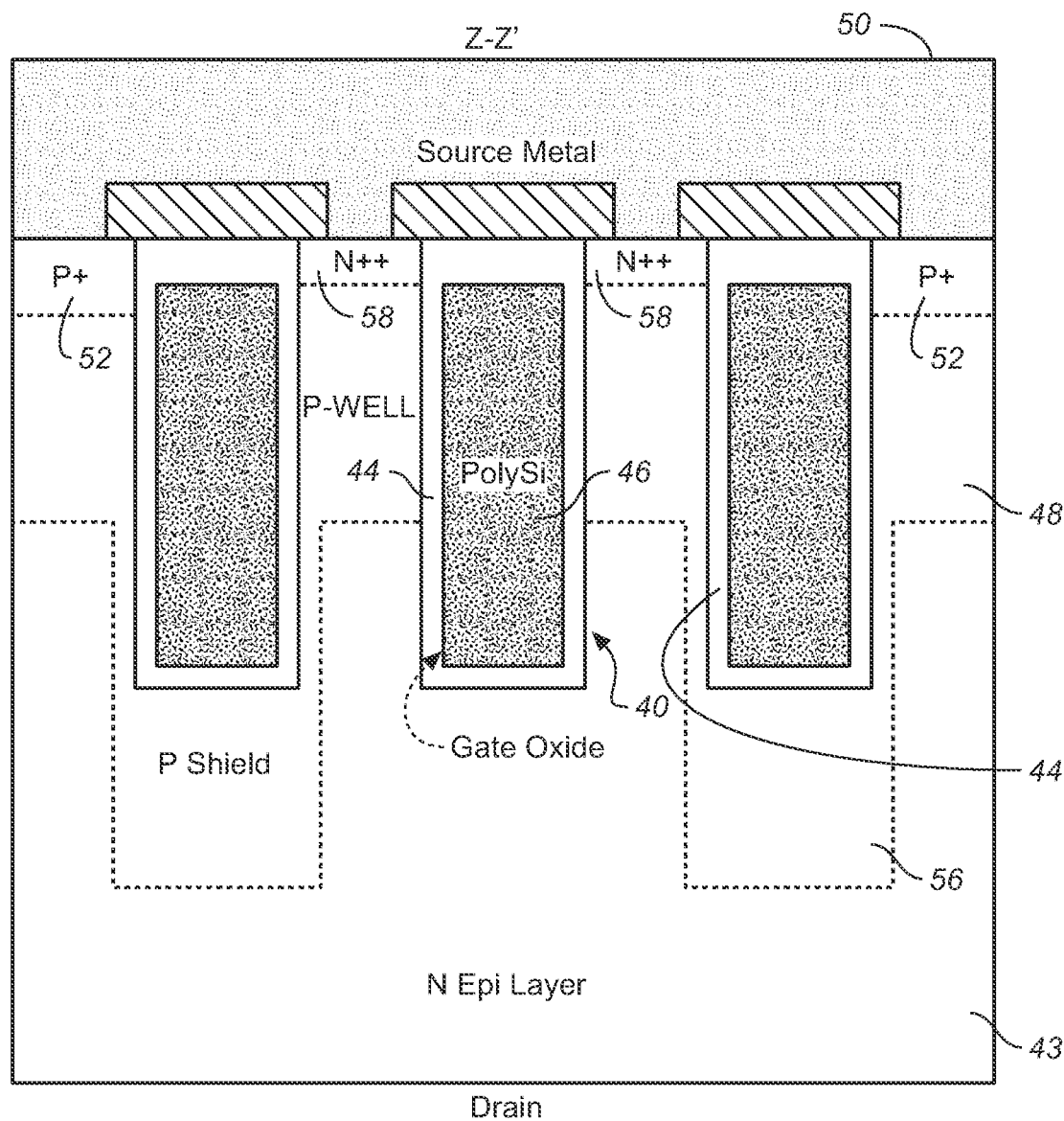
FIG. 6 is a diagonal cross-sectional view of the resulting MOSFET along line Z-Z' in FIG. 3, showing conducting cell areas (middle of FIG. 6) and non-conducting cell areas.

FIG. 6 is a diagonal cross-sectional view of the resulting MOSFET along line Z-Z' in FIG. 3, where the cross-section cuts across the active cell portions (middle of FIG. 6) that conduct current and the inactive cell portions that abut the P-shield regions 56.

The P-shield region 56 separation is optimized to achieve a lower electric field across the gate oxide near the bottom of the gate trenches 40 and a more uniform electric field distribution in the N-epi layer 44 (drift region).

Importantly, as shown in FIG. 3, only a small portion of the semiconductor area is used for the deep P-shield regions 56, so the current conducting portion of the cells is much greater than the non-conducting portion. Further, since all the trenches 40 are used for gates to control current, and there is no stringent alignment requirement between the P-shield region 56 and the trenches 40, the gate pitch can be very small, which increases the current density of the MOSFET and reduces the on-resistance.

As seen by the P-shield mask openings 42 in FIG. 3, it is preferred that the length of the P-shield region under a trench is less than the spacing between P-shield regions.

Further, the P-shield regions 56 reduce capacitive coupling between the gates and the N-epi layer 44. This lowers the overall gate capacitance to improve switching speeds.

FIGS. 7-15 illustrate process steps for forming the MOSFET of FIGS. 4-6. The cross-section directions are labeled and refer to the directions shown in FIG. 3.

Figure 7:
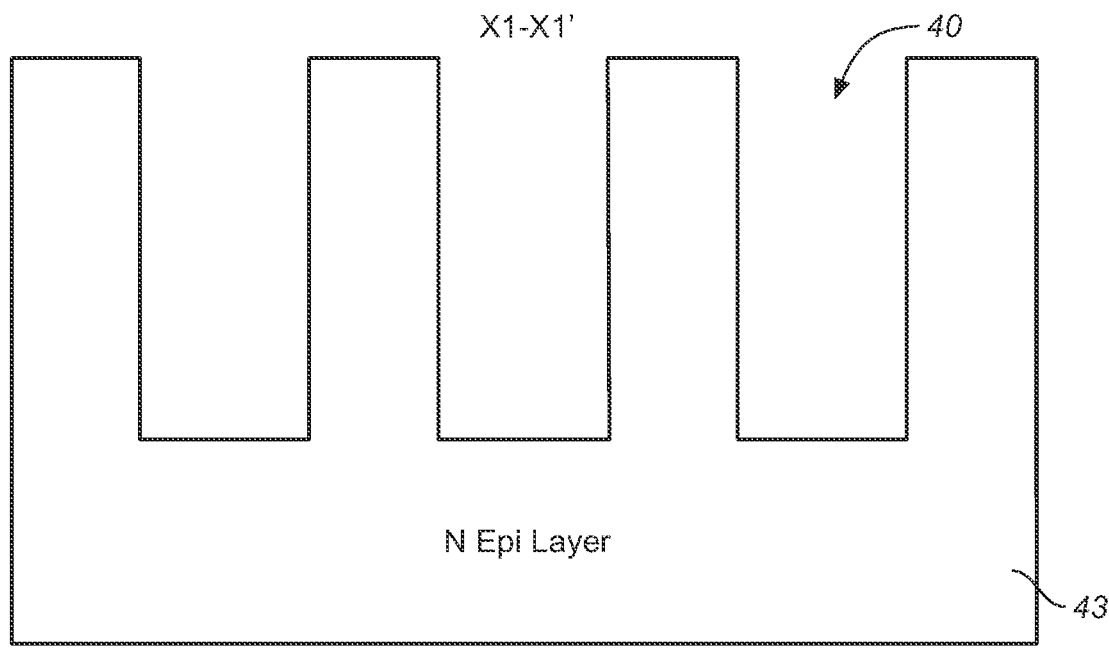
FIGS. 7-15 illustrate process steps for forming the MOSFET of FIGS. 4-6. The cross-section directions are labeled and refer to the directions shown in FIG. 3.

FIG. 7 is taken along line X1-X1' in FIG. 3 and illustrates the N-epi layer 43 after undergoing a masked RIE etch to form the linear trenches 40 in FIG. 3. Although the cells in the examples form parallel strips, the cells can be closed, such as squares, hexagons, or circles.

Figure 8:
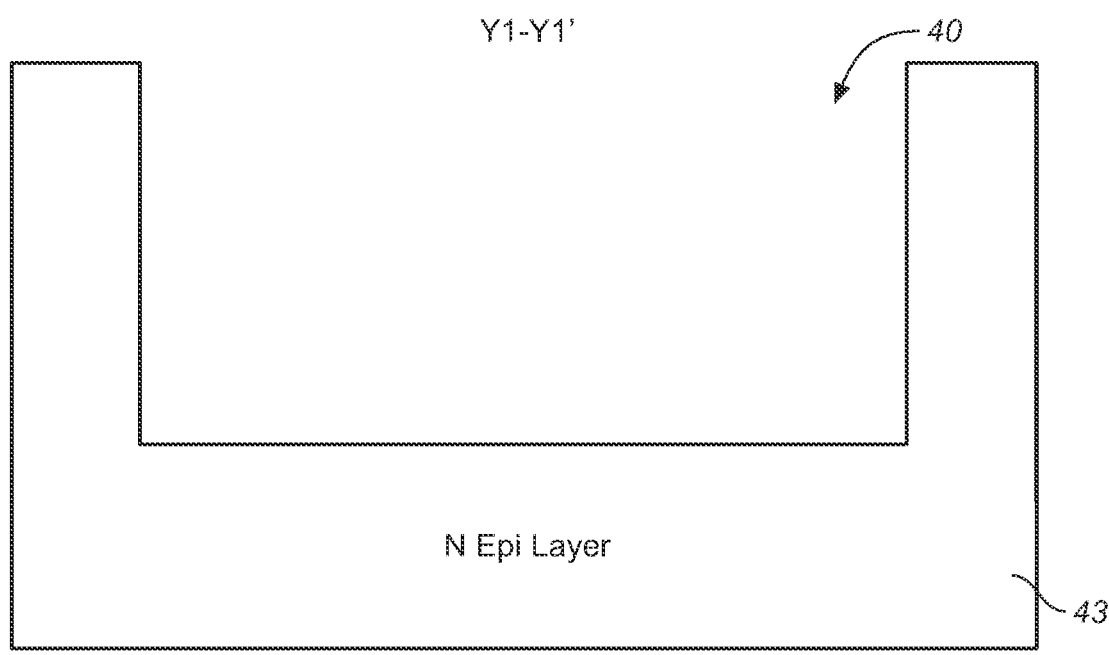

FIG. 8 is taken along line Y1-Y1' in FIG. 3 and illustrates a single trench 40.

Figure 9:
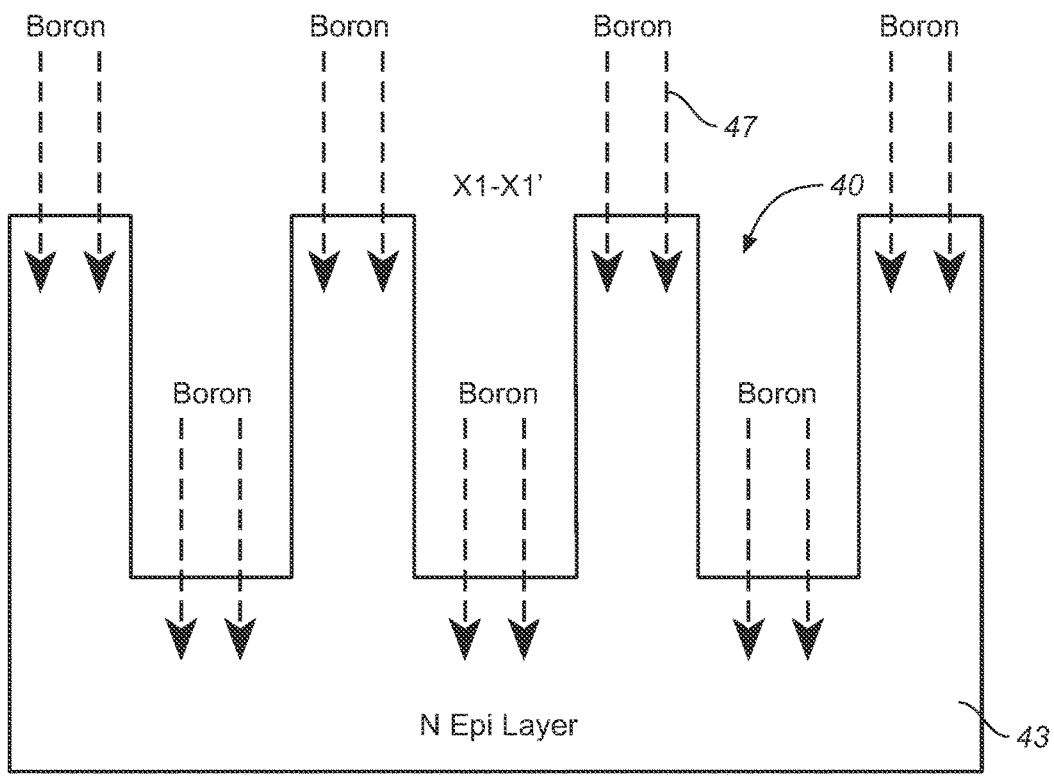

FIG. 9, taken across line X1-X1' in FIG. 3, illustrates a blanket implantation 47 of P-type dopants (such as Boron) into the semiconductor wafer surface. The implantation through the trenches 40 forms the deep P-shield regions, and the implantation into the semiconductor surface forms the P-well.

Figure 10:
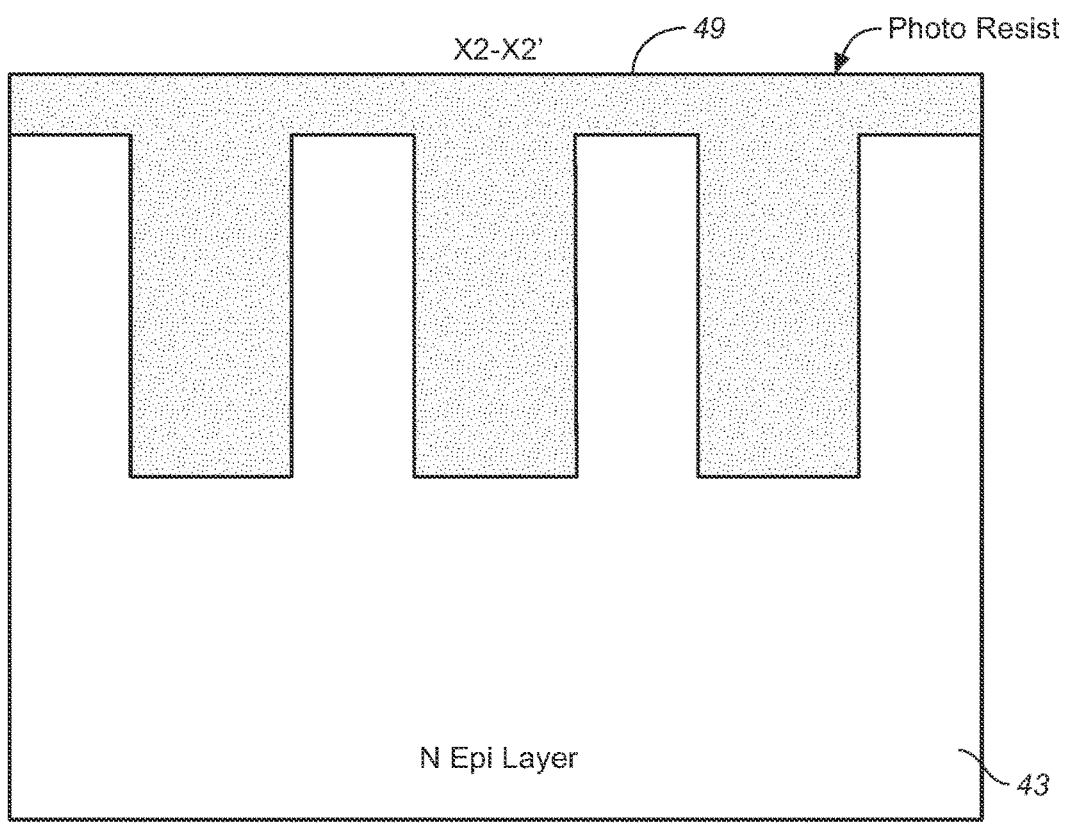

FIG. 10, taken across line X2-X2' in FIG. 3, shows an area that is blocked by the implant mask (photoresist 49), so there is no Boron implantation in that area.

Figure 11:
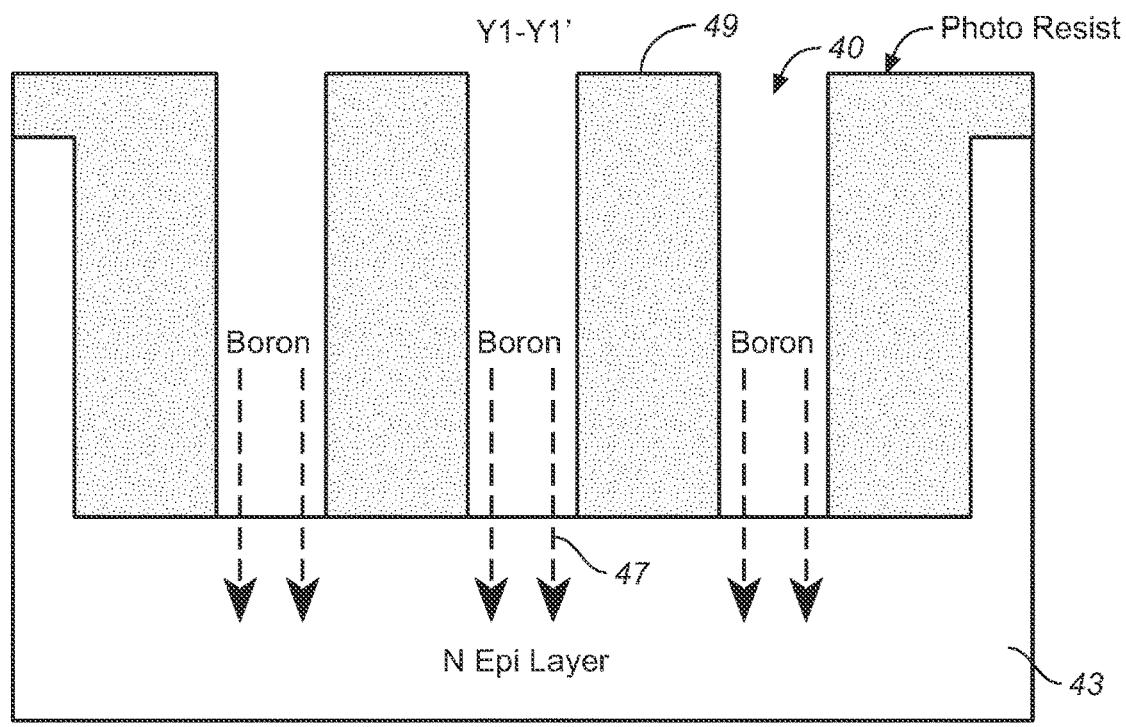

FIG. 11, taken across line Y1-Y1' in FIG. 3, shows a single trench 40 with the photoresist 49 implant mask selectively blocking areas from the Boron implantation 47. For simplicity, only three areas along the trench 40 are shown relatively close together being doped with Boron to form the deep P-shield regions. In an actual device, the trenches 40 are much longer relative to their width, the spacing of the mask openings is greater, and there are many more rows of the deep P-shield regions formed.

Figure 12:
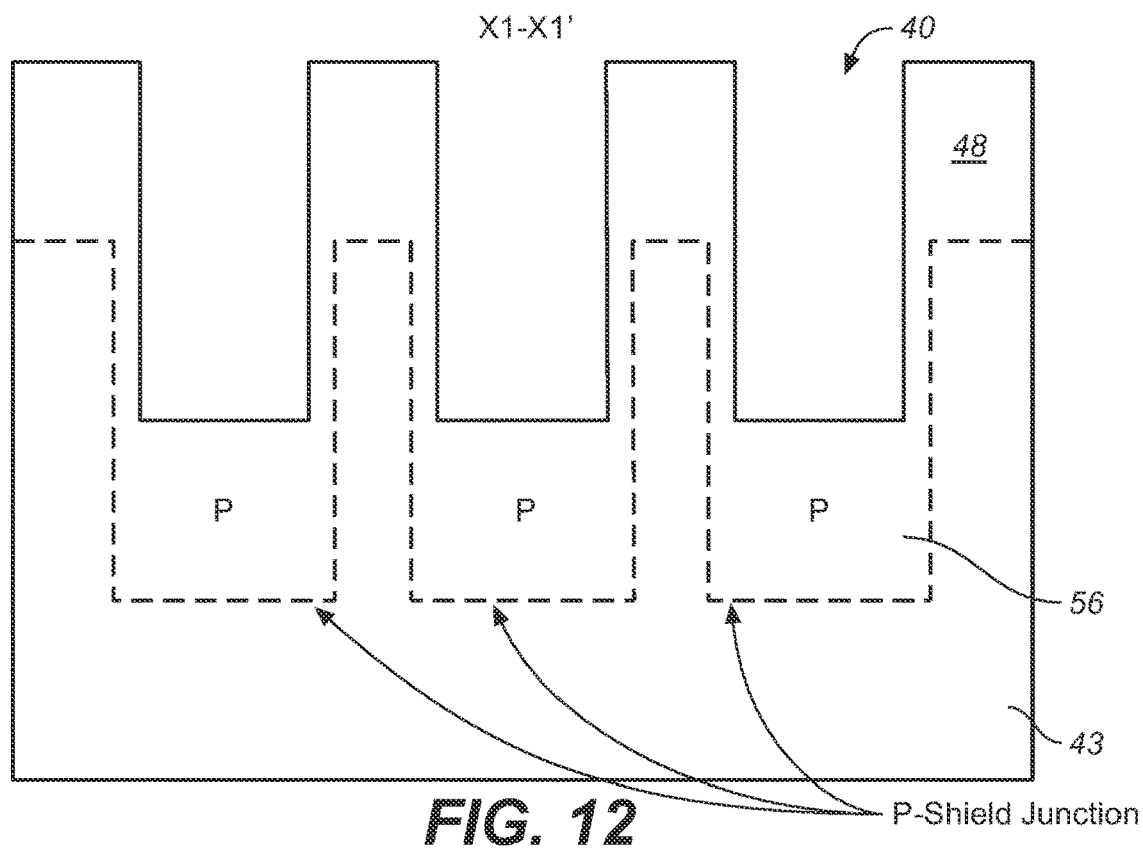

FIG. 12, taken across line X1-X1' in FIG. 3, shows the resulting P-shield regions 56 and P-well 48 after activation of the Boron dopants.

Figure 13:
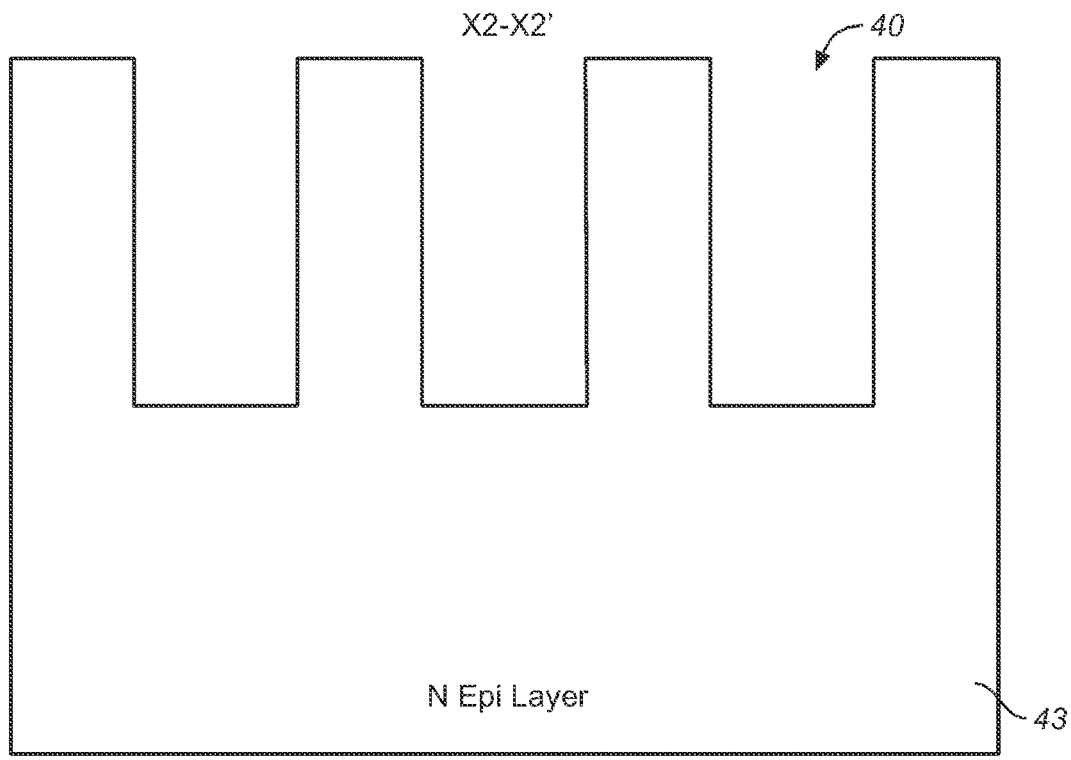

FIG. 13, taken across line X2-X2' in FIG. 3, after P-shield region implantation, and shows how the implant mask prevented the P-shield regions from being implanted in those areas.

A subsequent p-type dopant implant, such as a Boron implant, may be later used to form the P-well 48 and P+ contact regions 52 for all areas of the cell. This may be done either after or before the trenches are filled with polysilicon. The doping to form the P-well may be conventional.

To activate the implanted dopants, a high temperature anneal is performed. The anneal step can be performed after each implant step or after all the implant steps and can be performed with or without surface protection layers.

Figure 14:
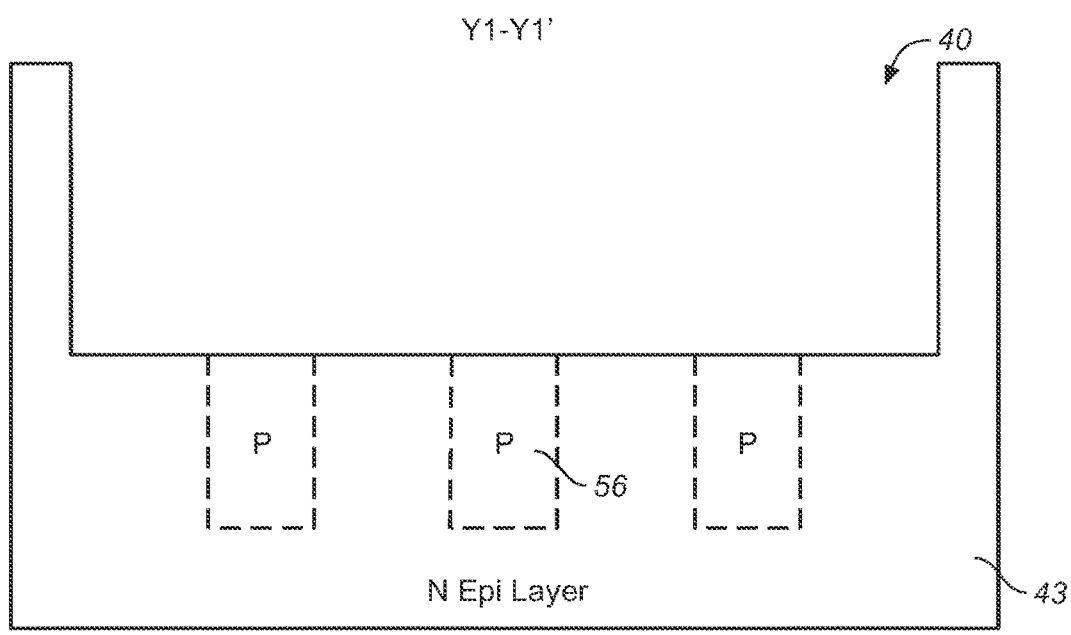

FIG. 14, taken across line Y1-Y1' in FIG. 3, shows the resulting P-shield regions 56 in the single trench 40.

Figure 15:
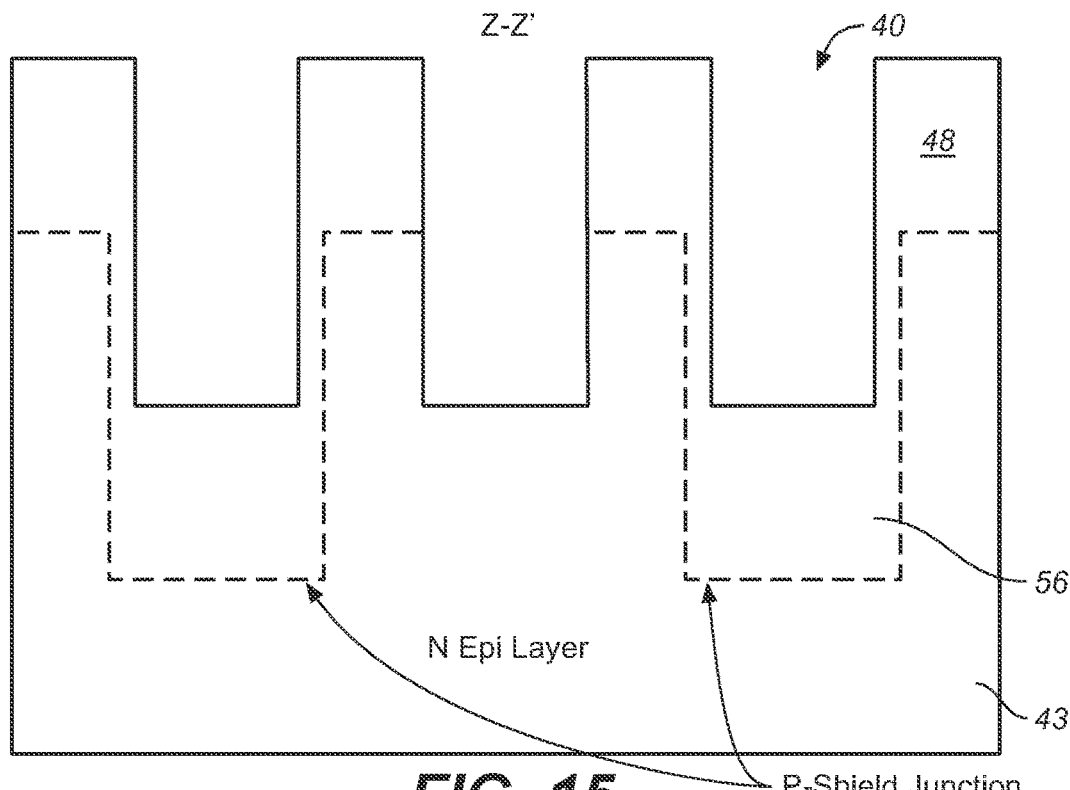

FIG. 15, taken across the diagonal line Z-Z' in FIG. 3, shows the two types of cell areas. The P-shield regions 56 are self-aligned with the trenches 40.

The trenches 40 are then oxidized to form the gate oxide 44 in FIGS. 4-6, followed by filling the trenches 40 with doped polysilicon 46 to form the gates, followed by a P-type implant to form the P+ contact regions 52 and possibly enhance the P-well 48, followed by an N-type implant to form the N+ source regions 58. These steps may be conventional. The P+ contact regions 52, or the P-well 48, or the N+ source regions 58 can optionally be formed before forming the trenches 40.

FIGS. 16-21 show modifications to the previous technique to form trench gates having a thick bottom oxide (only for the active cell areas) for enhancing ruggedness and reducing gate capacitance. FIGS. 16-21 are taken along the direction of a single trench (along line Y1-Y1' in FIG. 3). The thick oxide is not formed in areas where there will be a deep P-shield region, as described below.

Figure 16:
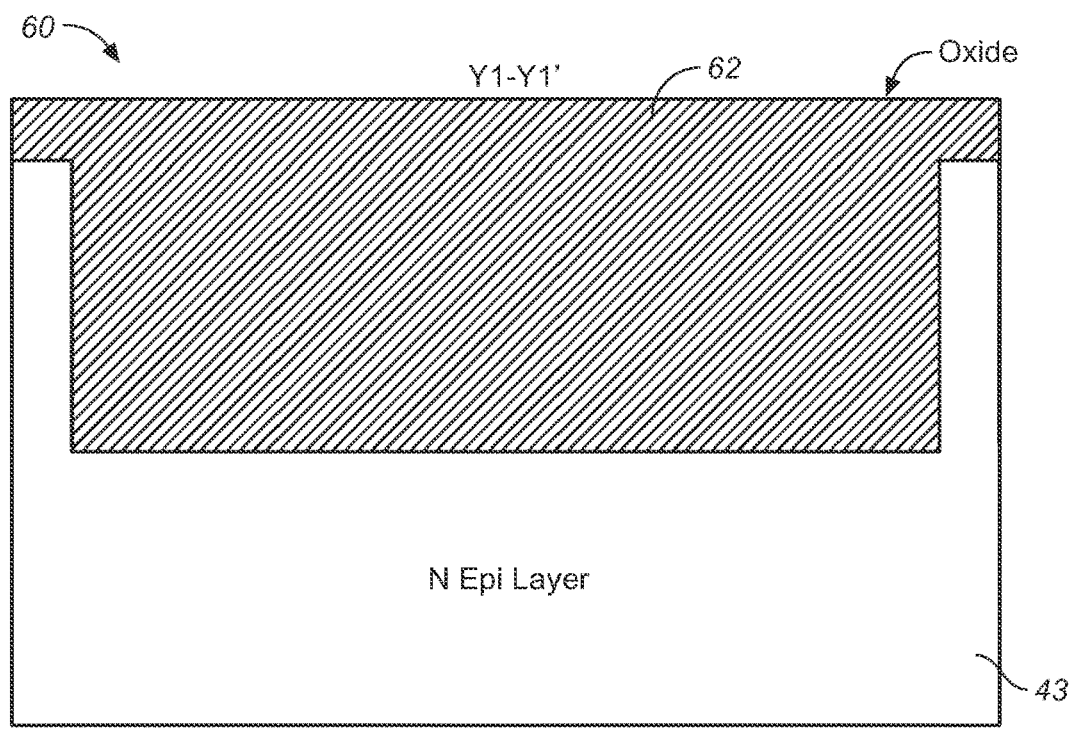
FIGS. 16-21 illustrate process steps for forming the MOSFETs of FIGS. 22-27

In FIG. 16, the trench 60 is filled with oxide 62 and preferably planarized by CMP.

Figure 17:
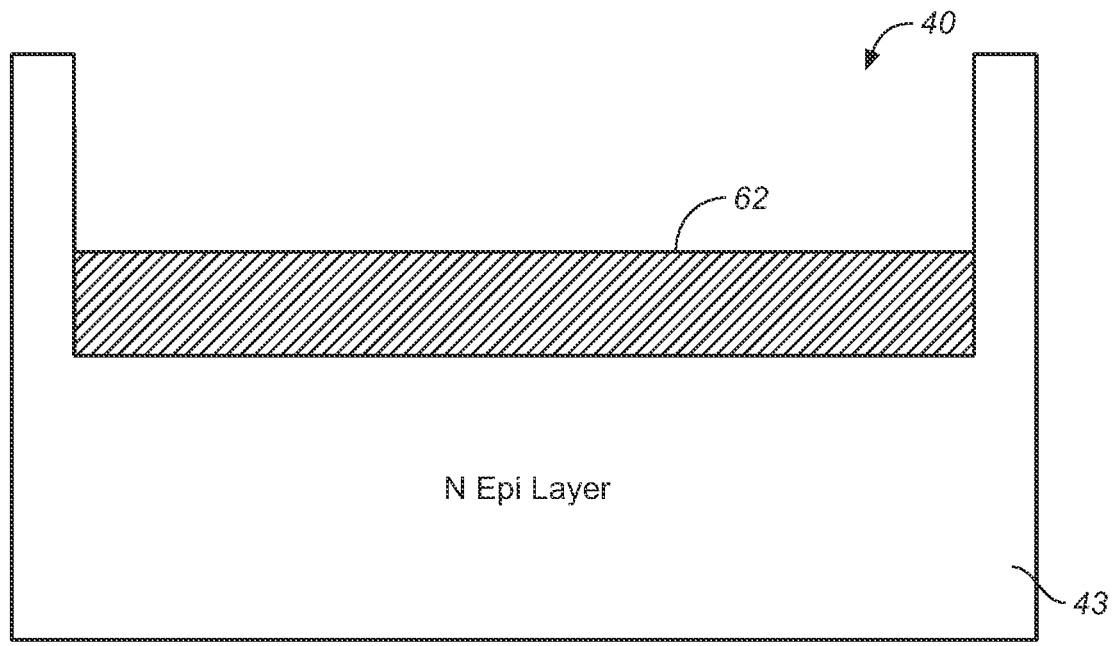

In FIG. 17, the oxide 62 is etched back using wet or dry etching to leave a relatively thick layer of oxide 62 at the bottom of the trench. In one example, the thickness of the oxide 62 is about 2-10 times the conventional thickness of the oxide that will be grown on the sidewalls of the trench 60.

Figure 18:
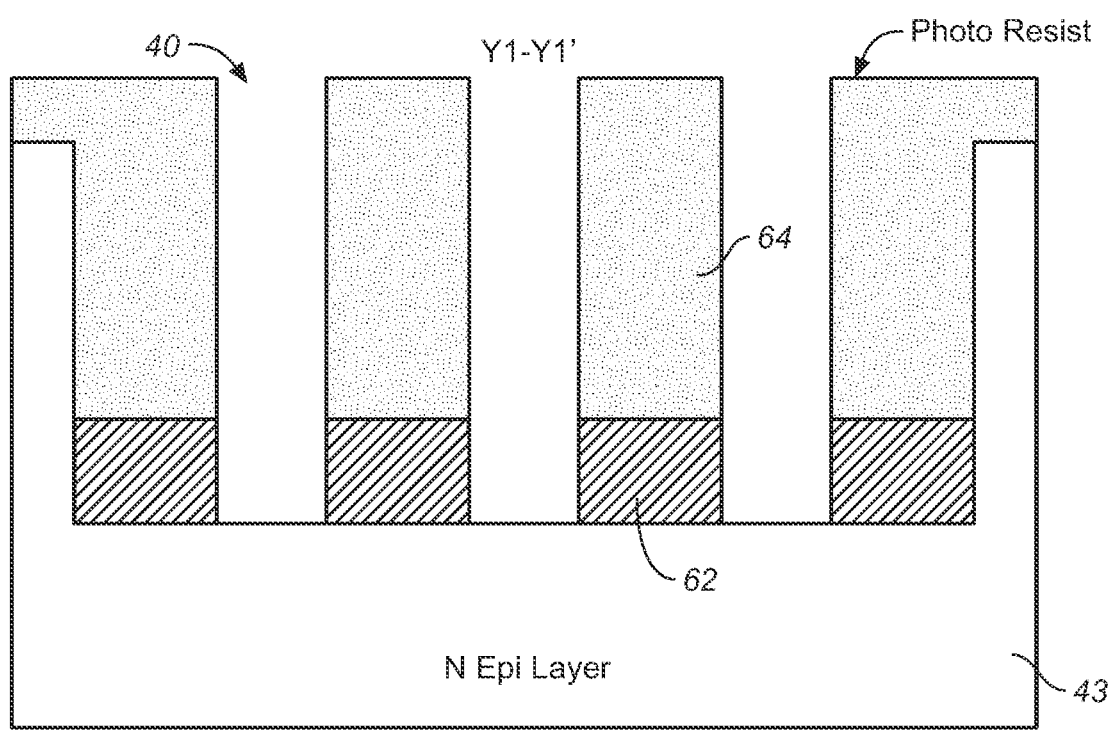

In FIG. 18, a photoresist mask 64 is formed to mask the oxide 62, and the oxide 62 is etched away in the selected areas where the deep P-shield regions are to be formed.

Figure 19:
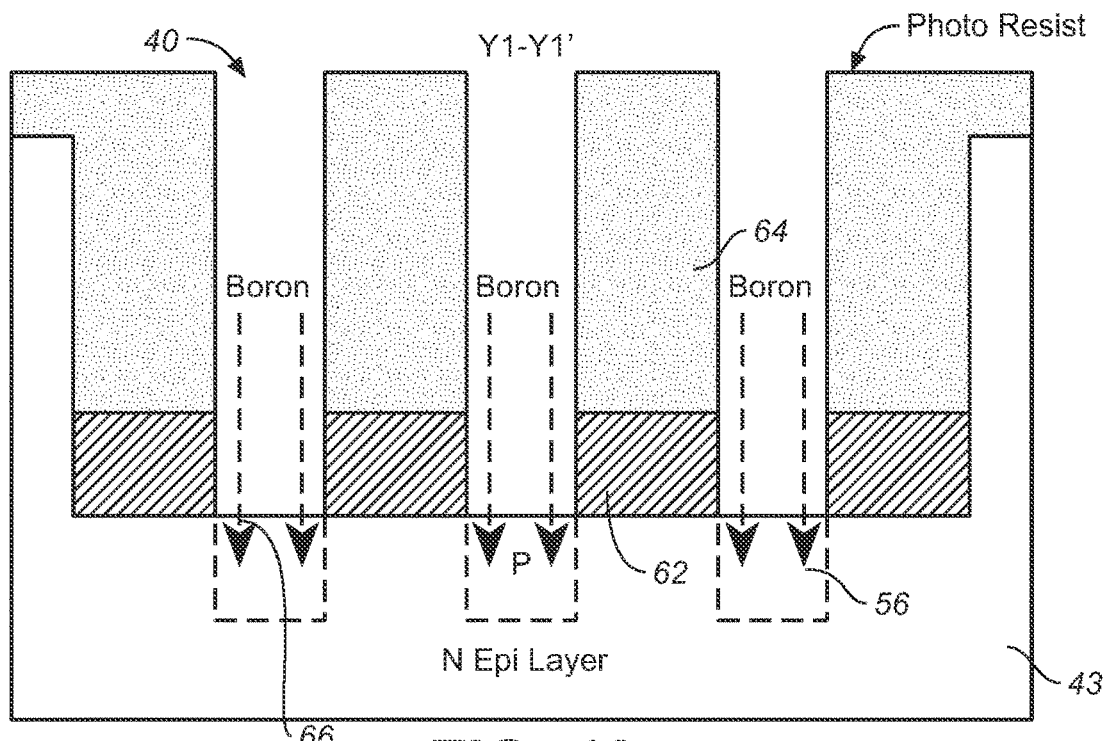

In FIG. 19, p-type dopants 66, such as Boron ions, are implanted through the openings to form the P-shield regions 56. Alternatively, the P-shield region 56 can be formed before forming the thick oxide 62.

Figure 20:
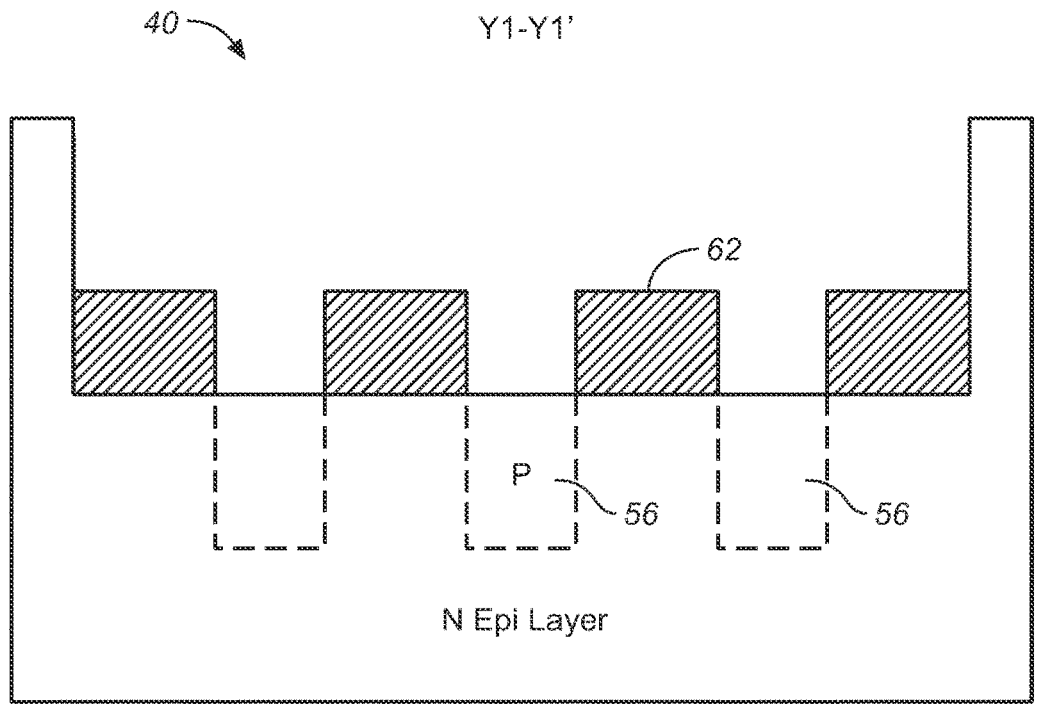

In FIG. 20, the photoresist mask 64 is removed.

Figure 21:
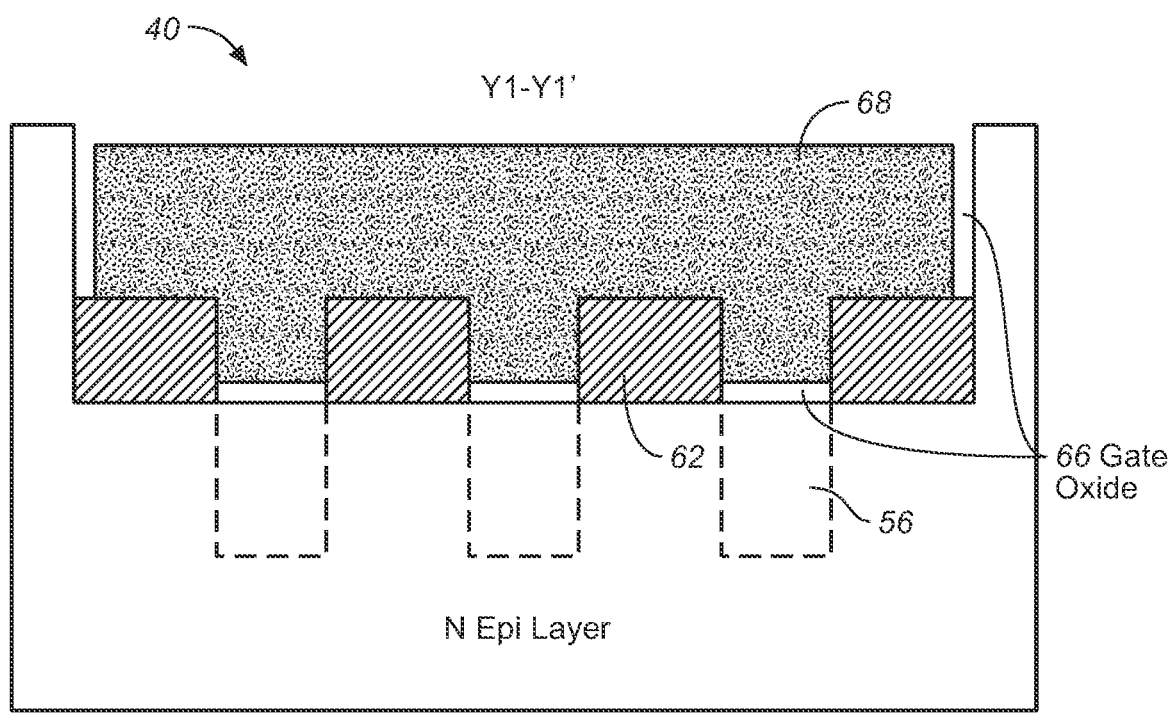

In FIG. 21, the semiconductor wafer is subjected to an oxygen atmosphere at a high temperature to grow a thin layer of gate oxide 66 on the exposed semiconductor surfaces. Doped conducting material such as polysilicon 68 is then deposited by CVD, and the excess polysilicon 68 is etched away to form the conductive gates.

Figure 22:
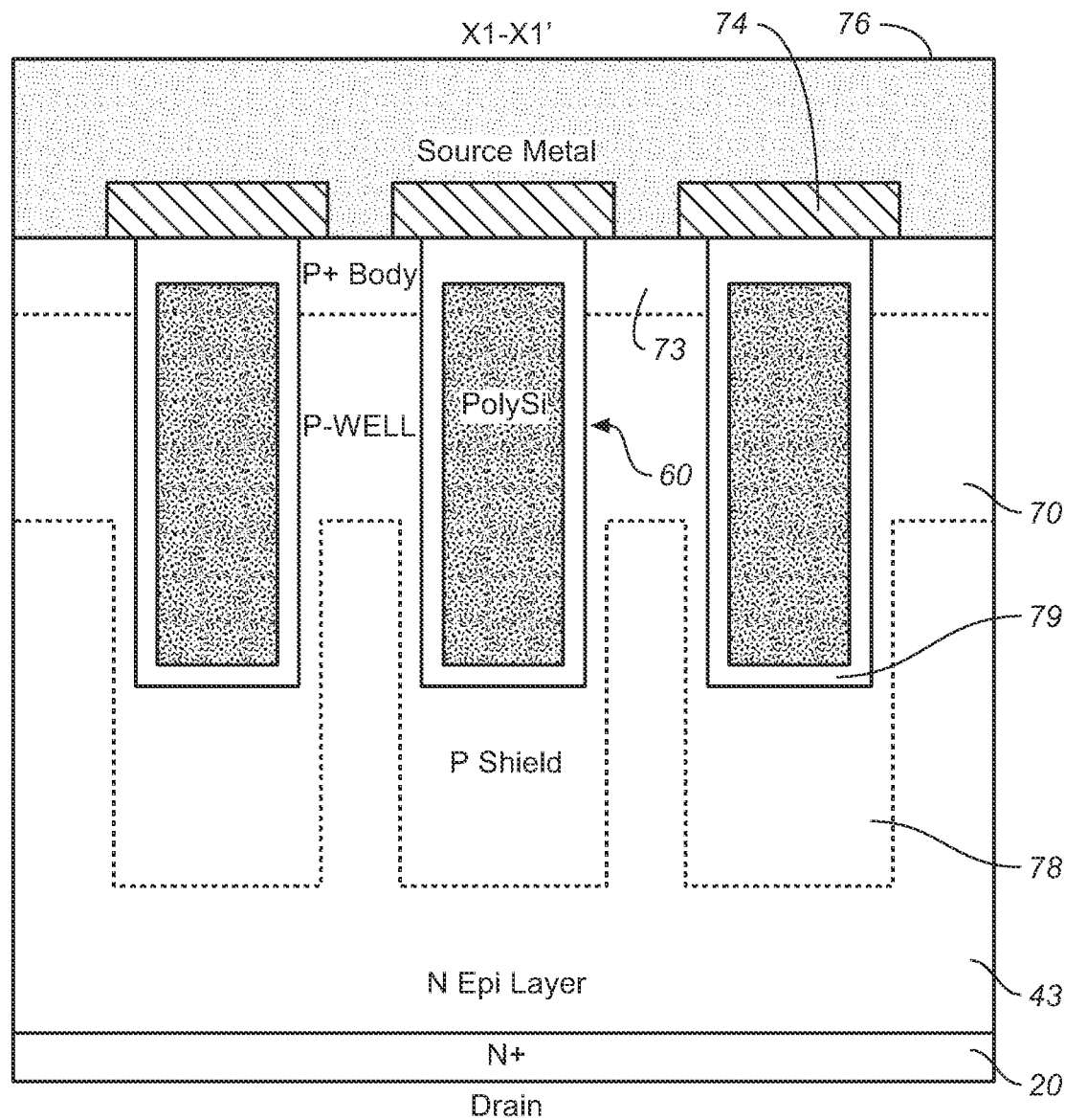
FIGS. 22-23 are cross-sections of a vertical MOSFET, in accordance with another embodiment, along lines X1-X1' and X2-X2' in FIG. 3 but having a thick bottom gate oxide in certain areas.
Figure 23:
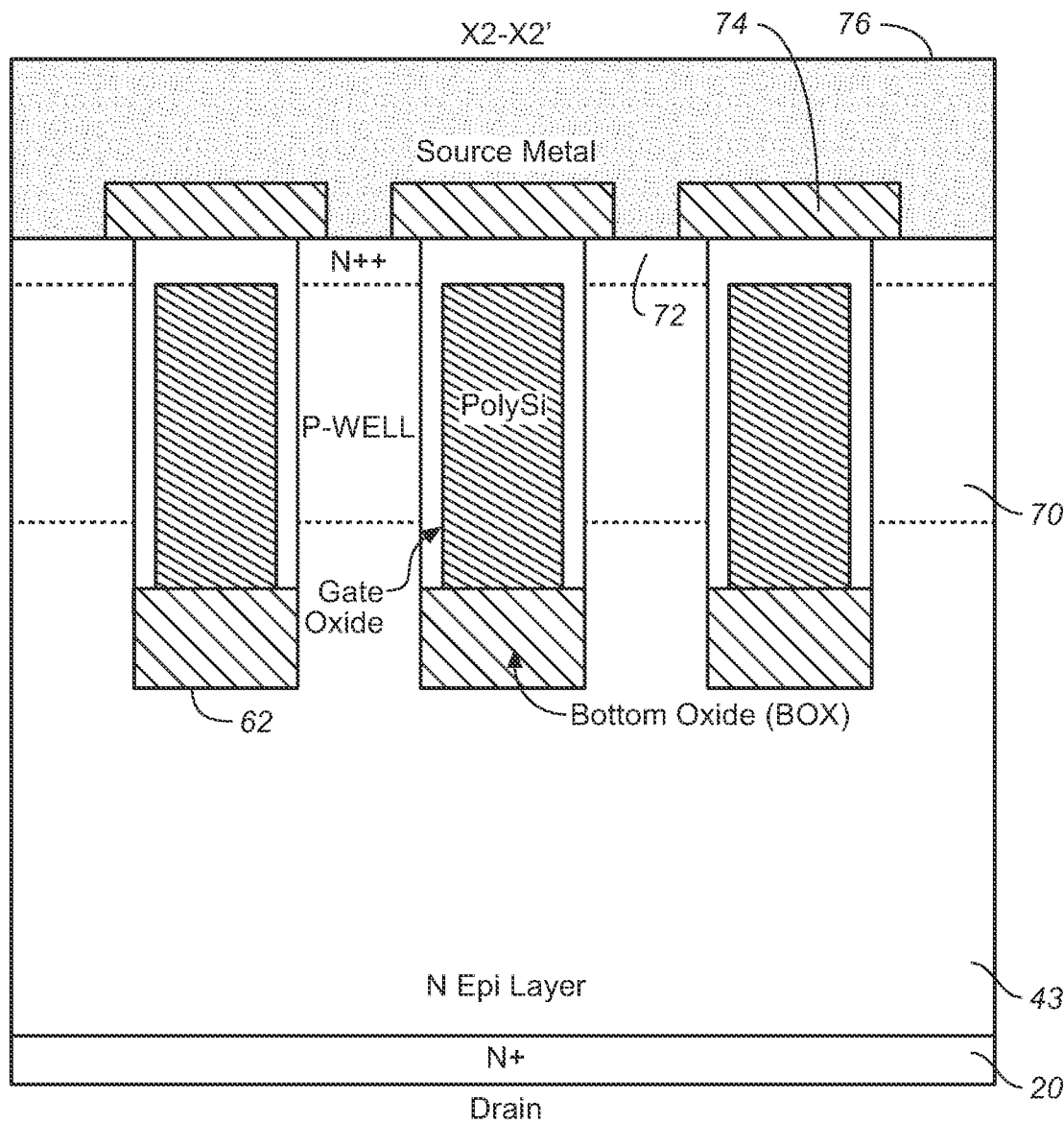
Figure 24:
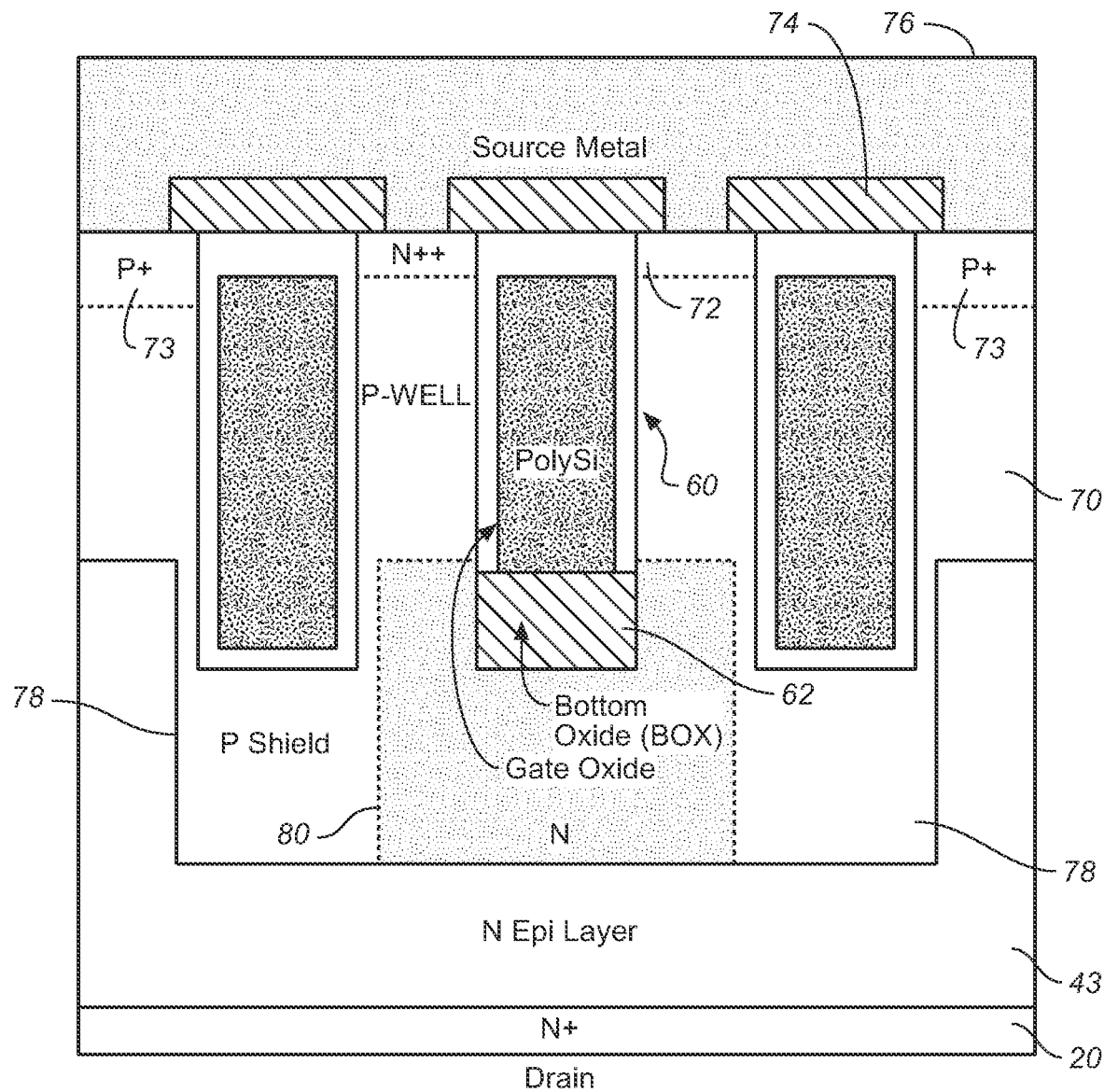
FIG. 24 is a cross-section of a vertical MOSFET, in accordance with another embodiment, along the diagonal line Z-Z' in FIG. 3 but having an N-enhancement region in certain areas for reducing on-resistance.

In FIGS. 22-24, conventional implantation steps are then performed to form the P-well 70, N+ source regions 72, P+ contact regions 73, dielectric layer 74, and source electrode 76. The P-well 70, source regions 72, and P+ contact regions 73 may be formed before or after the trench etch, such as if the high heat to activate the implanted dopants would have an undesired effect on any gate oxide in the trenches. The implanted p-type dopant ions are activated by heat to form the deep P-shield regions 78, which are electrically connected to the source electrode 76 via the P-well 70.

FIG. 22 is a cross-section of the resulting MOSFET along line X1-X1' in FIG. 3, which cuts across the P-shield regions 78. Note that the gate oxide 79 above the P-shield regions 78 is thin, since there is not a large potential difference between the gate voltage and the P-shield voltage. Therefore, a thick oxide at the bottom of the trenches 60 in those areas is not needed.

FIG. 23 is a cross-section along line X2-X2' in FIG. 3 cutting across active portions of the cells where current is conducted. Note that the oxide 62 at the bottom of the trenches in that area is thick avoid breakdown due to the relatively high electric field across the gate oxide 62 in that area when the MOSFET is off.

FIG. 24 illustrates a modification to the MOSFET of FIGS. 22 and 23. FIG. 24 is a diagonal cross-section along line Z-Z' in FIG. 3, where an extra N-implant (Phosphorus or Arsenic for a silicon wafer) is performed, such as prior to the oxide deposition step in FIG. 16, to form N-enhancement regions 80 as part of the drift region. This increases the overall N-type dopant concentration in the N-epi layer 43 in those areas. Other N-type dopants would be used for non-silicon semiconductor materials. Note that the N-enhancement regions 80 only abut the trenches 60 in areas where an N-channel can be created and are spaced away from the trenches 60 that abut the deep P-shield regions 78, since no N-channel is desired in those areas. The N-enhancement regions 80 abutting the trenches (gates) result in a lower resistivity path through the N-epi layer 43 to improve the on-resistance. The N-enhancement regions 80 also improve current distribution due to the low resistivity and relatively large area of the N-enhancement regions 80. The N-enhancement may, for example, increase the N-type dopant concentration by two or more times compared to the epitaxial layer 43. Furthermore, the N-enhancement region 80 can be used for obtaining charge balance with the P-shield regions 78 so that the electric field inside the N-epi layer 43 (drift region) can be made more uniform and the device breakdown voltage can be increased.

Figure 25:
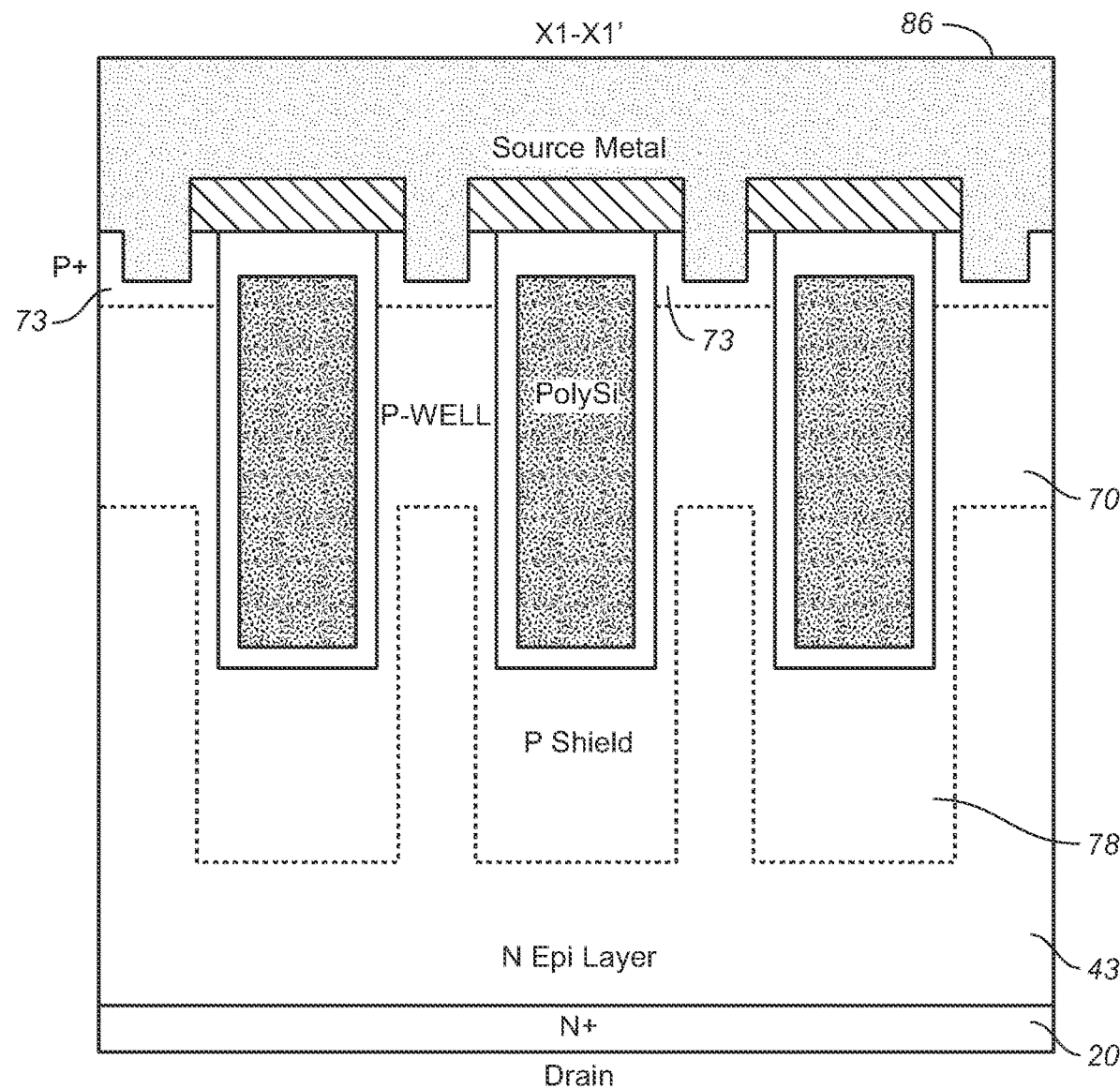
FIGS. 25-27 are cross-sections of a vertical MOSFET similar to FIGS. 22-24, in accordance with another embodiment, along lines also shown in FIG. 3, but where the metal source electrode extends into the semiconductor surface between the gates.
Figure 26:
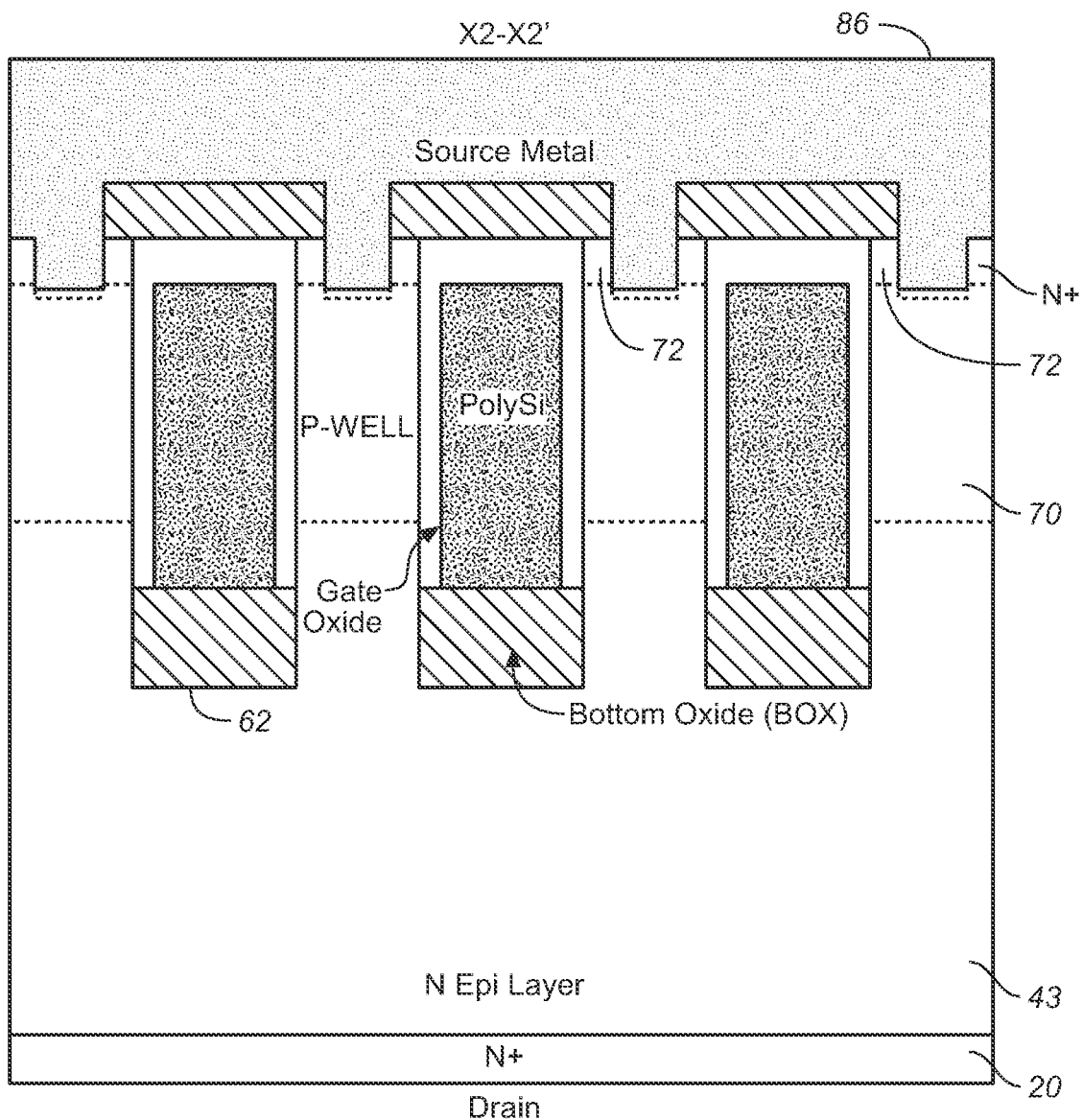

FIGS. 25 and 26 are different cross-sections of a slightly modified MOSFET where the source electrode 86 metal extends deeper into the P+ contact regions 73 (FIG. 25) and into the N+ source regions 72 (FIG. 26) for better electrical contact. FIG. 25 is a cross-section along line X1-X1' in FIG. 3, cutting across the P-shield regions 78. FIG. 26 is a cross-section along line X2-X2' in FIG. 3, cutting across only the active cell portions.

Figure 27:
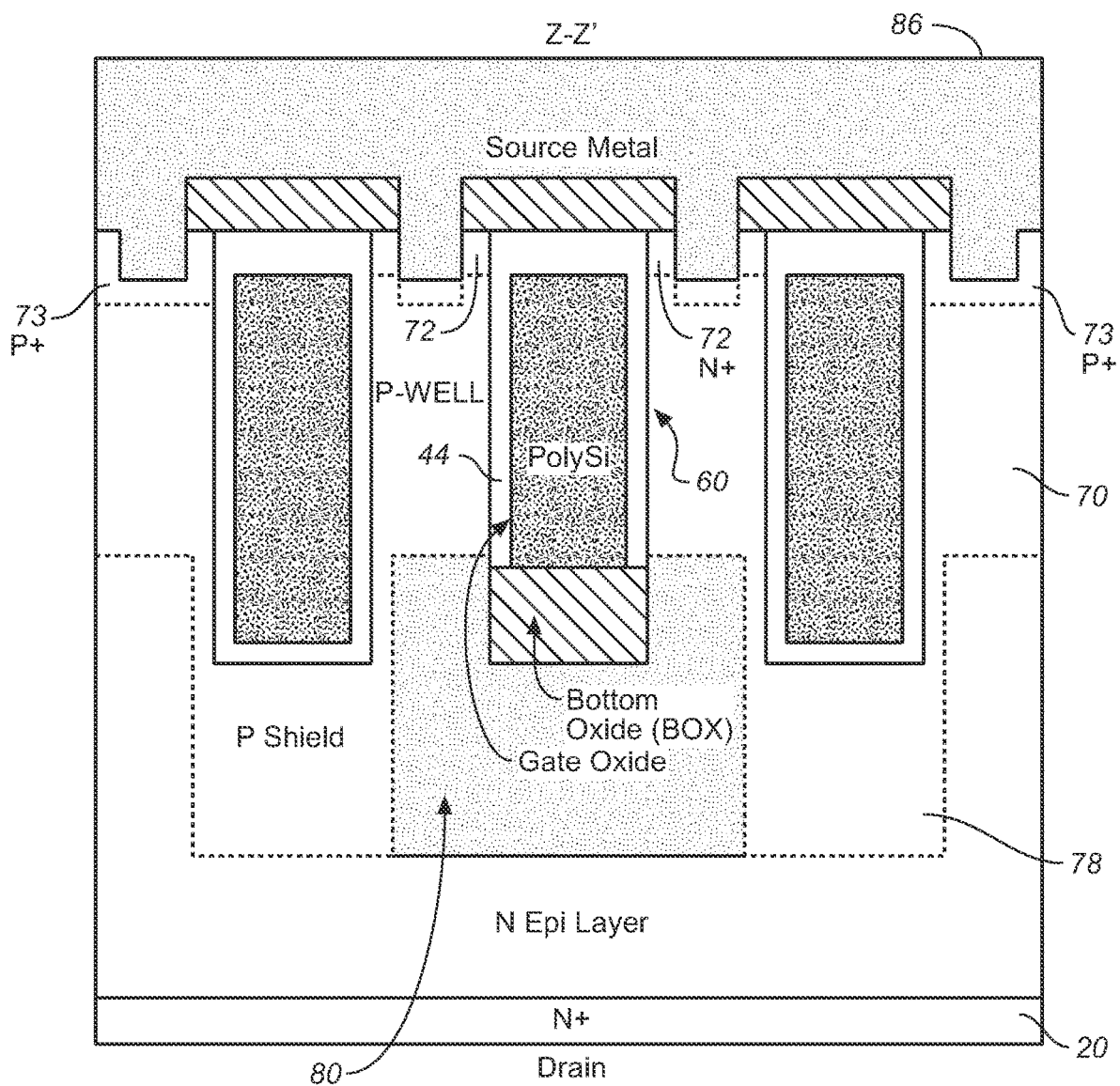

FIG. 27 illustrates a modification of the MOSFET of FIGS. 25 and 26 by adding the N-enhancement region 80. FIG. 27 is a diagonal cross-section along line Z-Z' in FIG. 3, cutting across P-shield regions 78 and an active cell portion.

Figure 28:
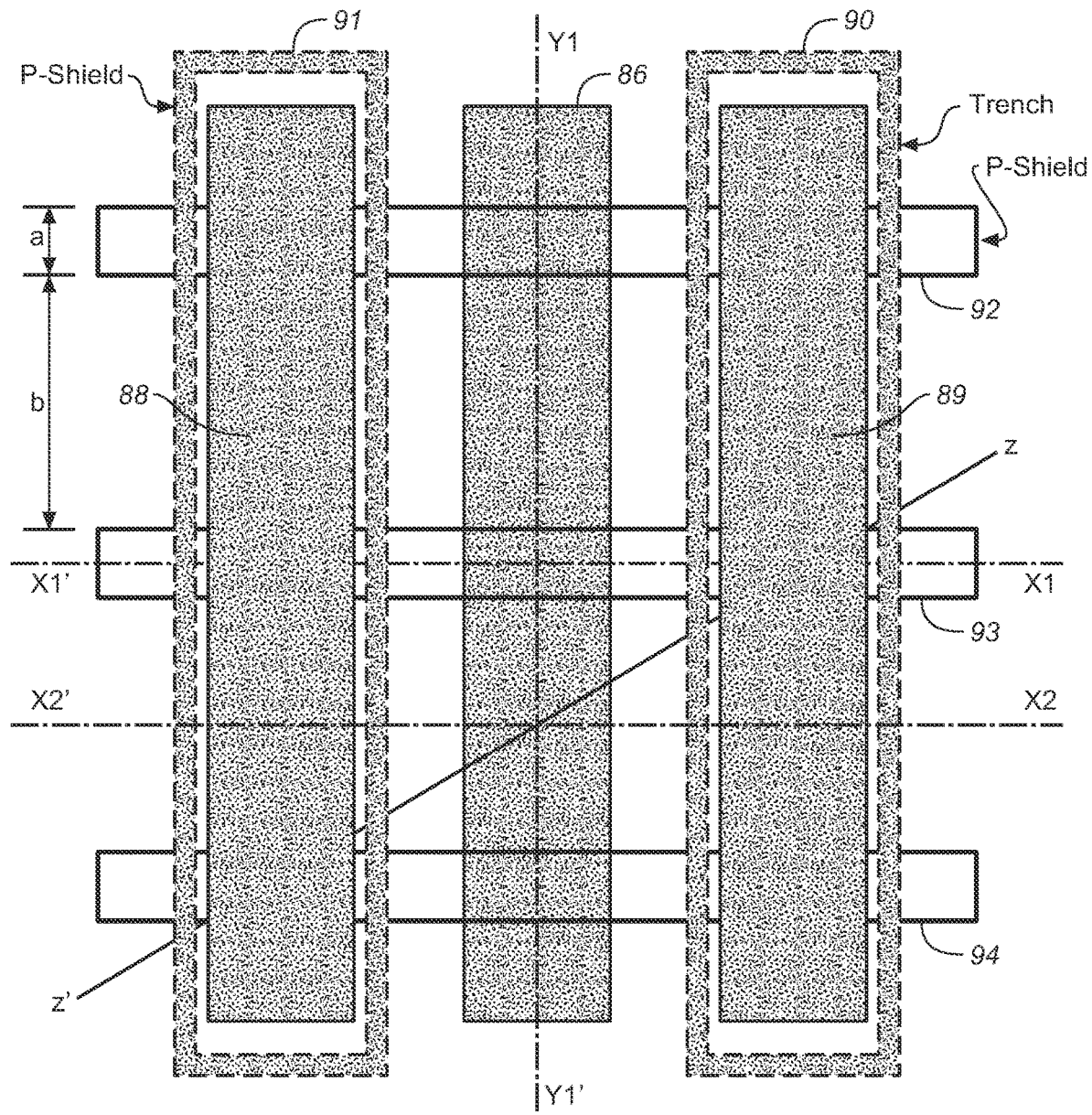
FIG. 28 is similar to FIG. 3 but with additional P-Shield regions running parallel to the gate electrodes. The resulting active region is therefore completely surrounded by P-shield regions.

FIG. 28 is similar to FIG. 3 but with additional P-Shield regions running parallel to the gate electrodes. The resulting active region is therefore completely surrounded by P-shield regions. The pattern is repeated for other cells. In FIG. 28, three parallel trenches are shown, where the center trench 86 is a gate trench for controlling current, and P-shield regions are formed through trenches 88 and 89 for shaping the electric field under the gate trench. P-implant mask openings 90-94 allow the P-dopants to be implanted into those areas. So, the difference between FIG. 28 and FIG. 3 is the addition of the P-shields on both sides of the gate trench 86.

Figure 29:
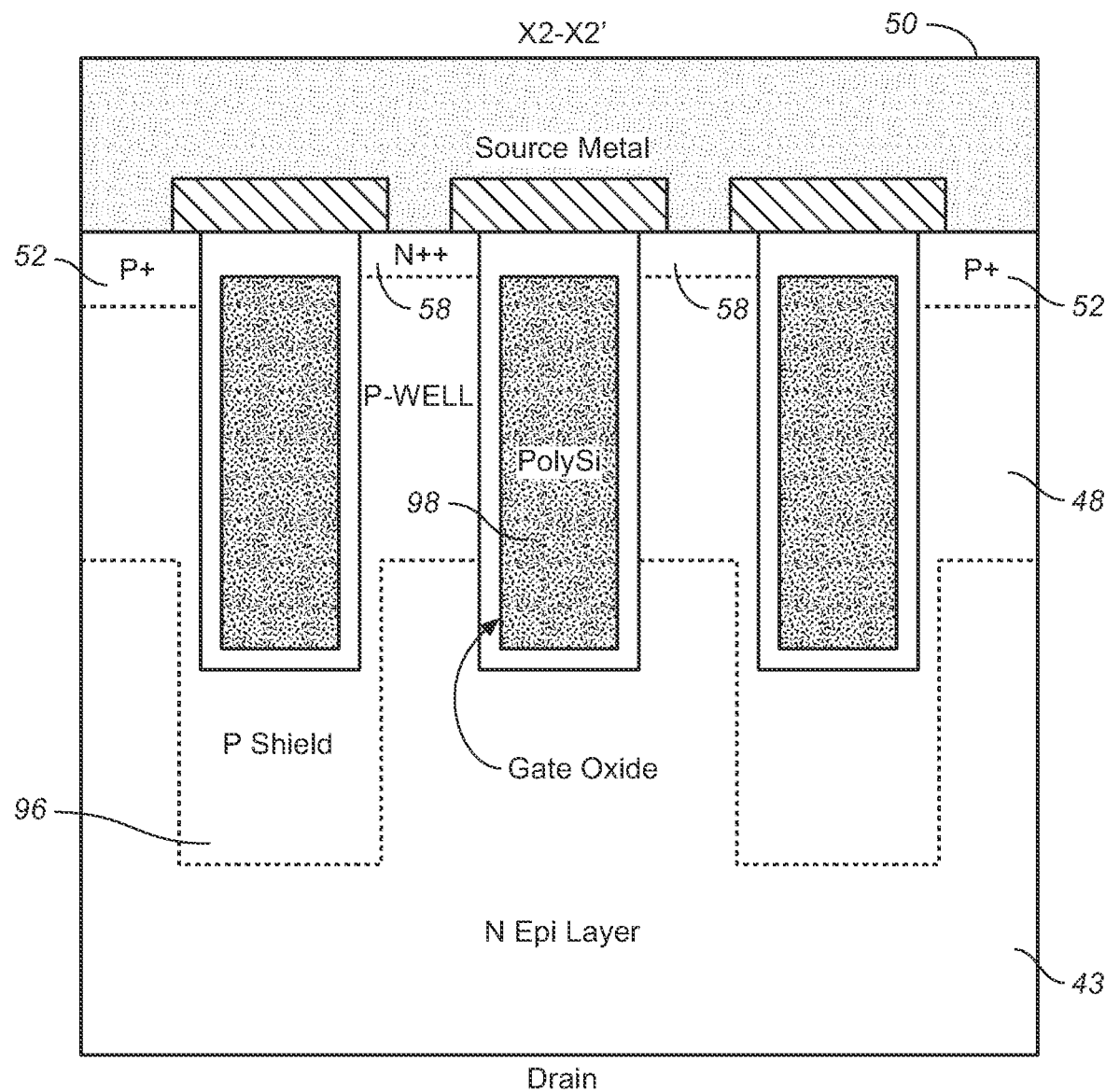
FIG. 29 is a cross section taken along line X2-X2' of FIG. 28.

FIG. 29 is a cross section taken along line X2-X2' of FIG. 28 after the MOSFET is formed. The P-shield regions 96 run along the trenched gate 98 and orthogonal to the gate 98.

In another embodiment, the orthogonal P-shield regions (formed using openings 92-94 in FIG. 28) are not needed if the P-shield regions running along the trenched gate 98 are sufficient to reduce the breakdown voltage.

In another embodiment, there are RFP electrodes (field plates) in parallel with the gate electrodes. The ratio between gate electrodes and RFP electrodes is used to optimize the trade-off between specific on-resistance Rsp and other device parameters such as ruggedness, capacitances, etc. For example, in FIGS. 28 and 29, the leftmost and rightmost trenches containing conductive material may be RFPs on both sides of the middle gate trench. The RFPs may be connected to the source electrode rather than to the gate electrode.

The proportions in all the figures are depicted for simplicity, and the relative layer thicknesses and region sizes will vary from those shown in the above figures. Optimal thicknesses, sizes, and doping concentrations can be determined by simulation.

Any of the disclosed features can be combined in any combination in a MOSFET, IGBT, or other trench-gated device to achieve the particular benefits of that feature for a particular application.

For some devices, the substrate has a conductivity type opposite to that of the drift region. For example, in FIGS. 4-6, a P+ substrate may be used to form a vertical NPNP structure. In such devices, turning on a vertical MOSFET initiates full turn on of the device.

The conductivities of all layers/regions can be made opposite to form a P-channel MOSFET rather than an N-channel MOSFET.

Although silicon is assumed in some examples, the semiconductor material can instead be silicon carbide, gallium nitride, silicon germanium, or other similar materials. Different dopant ions may be suitable for the non-silicon substrates.

Although the devices describe are vertical devices having a top metal electrode contacting the source and a bottom metal electrode contacting the drain, the inventive techniques also apply to lateral devices with both power electrodes on top. In one example, an N+ buried layer extends to N+ sinkers that carry current to a top drain electrode.

Details of additional conventional fabrication steps may be found in U.S. Pat. Nos. 8,076,719 and 8,466,025, incorporated herein by reference.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A trenched power device comprising:
    a semiconductor substrate;
    a drift region of a first conductivity type overlying the substrate;
    a well region of a second conductivity type overlying the drift region;
    a source region of the first conductivity type overlying the well region;
    a source electrode electrically contacting the source region and the well region;
    a first trench, the first trench having a first trench portion and a second trench portion;
    the first trench portion having first vertical sidewalls along the well region and along a portion of the drift region, the first trench portion being insulated and containing a first conductor to form a first gate, wherein applying a gate voltage to the first conductor greater than a threshold voltage inverts the well region along the sidewalls to create a conductive channel between the source region and the drift region;
    the second trench portion having second vertical sidewalls along the well region, the second trench portion being insulated and containing the first conductor; and
    a shield region of the second conductivity type below the second trench portion and along a portion of the second vertical sidewalls, such that the second vertical walls do not abut the drift region so that no conductive channel is created between the source region and the drift region when the gate voltage is greater than the threshold voltage, wherein the shield region is electrically connected to the source electrode via the well region.

2. The device of claim 1 wherein the shield region reduces an electric potential between the first conductor in the first trench portion and the drift region when the power device is in an off state.

3. The device of claim 1 further comprising an enhanced drift region area below the first trench portion, the enhanced drift region area being of the first conductivity type and having a dopant concentration higher than a dopant concentration of the drift region below the second trench portion.

4. The device of claim 1 further comprising a plurality of trenches identical to the first trench, the plurality of trenches containing the first conductor and being electrically connected together.

5. The device of claim 4 wherein the trenches are substantially linear and parallel to each other.

6. The device of claim 5 wherein each of the trenches contains a third trench portion substantially identical to the first trench portion and contains a fourth trench portion substantially identical to the second trench portion, wherein areas substantially identical to the fourth trench portion are spaced from each other along each of the trenches.

7. The device of claim 6 wherein the fourth trench portion and the areas substantially identical to the fourth trench portion are in the same positions along each of the trenches.

8. The device of claim 7 wherein all trenches are substantially identical.

9. The device of claim 1 wherein the shield regions are more highly doped than the well region.

10. The device of claim 1 wherein the shield region has substantially the same dopant concentration as the well region.

11. The device of claim 1 wherein the device is a vertical MOSFET.

12. The device of claim 1 wherein the semiconductor substrate is of the first conductivity type.

13. The device of claim 1 wherein the semiconductor substrate is of the second conductivity type.

14. The device of claim 1 wherein the shield region is a first shield region, the device further comprising:
second trenches running parallel to the first trench and orthogonal to the first shield region, the second trenches having third vertical sidewalls and containing the first conductor; and
second shield regions of the second conductivity type below the second trenches and along a portion of the third vertical sidewalls, such that the third vertical walls do not abut the drift region so that no conductive channel is created between the source region and the drift region when the gate voltage is greater than the threshold voltage, wherein the second shield regions are electrically connected to the source electrode via the well region.

15. The device of claim 1 wherein the shield region is one of a plurality of substantially identical shield regions, wherein the shield regions have lengths, wherein the shield regions are spaced apart by substantially identical spacings, and where the lengths are less than the spacings between shield regions.

16. The device of claim 1 wherein the shield region is one of a plurality of substantially identical first shield regions running substantially orthogonal to the first trench and spaced along the first trench.

17. The device of claim 16 further comprising:
first additional trenches parallel to the first trench and on opposite sides of the first trench; and
the first additional trenches being insulated and containing the first conductor, the first conductor in the first additional trenches being electrically connected to the source electrode to form recessed field plates.

18. The device of claim 17 further comprising:
second additional trenches containing the first conductor electrically connected to the first conductor in the first trench to form parallel gates,
wherein a ratio between the first additional trenches, forming parallel recessed field plates, and the second additional trenches, forming parallel gates, results in a trade-off between specific on-resistance Rsp and other device parameters.

19. A method for forming a trenched power device comprising:
forming a drift region of a first conductivity type overlying a semiconductor substrate;
etching trenches into the drift region;
masking the trenches to provide mask openings over portions of the trenches;
implanting dopants of a second conductivity type through bottom surfaces of the trenches to form shield regions of the second conductivity type below areas of the trenches;
insulating sidewalls of the trenches;
at least partially filling the trenches with a conductive material to form trench gates;
forming a well region of the second conductivity type overlying the drift region;
forming a source region of the first conductivity type overlying the well region;
forming a source electrode electrically contacting the source region and the well region, wherein the shield regions are electrically connected to the source electrode via the well region;
wherein the implanting dopants of the second conductivity type to form shield regions and the forming the well region result in the trench gates having two trench gate portions comprising a first trench gate portion and a second trench gate portion;
the first trench gate portion having first vertical sidewalls along the well region and along a portion of the drift region, wherein applying a gate voltage to the trench gates greater than a threshold voltage inverts the well region along the sidewalls to create a conductive channel between the source region and the drift region; and
the second trench gate portion having second vertical sidewalls along the well region, the shield regions being below the second trench portions and along a portion of the second vertical sidewalls, such that the second vertical walls do not abut the drift region so that no conductive channel is created between the source region and the drift region when the gate voltage is greater than the threshold voltage.

20. The method of claim 19 wherein the well region is formed after the step of etching the trenches.

21. The method of claim 19 wherein the step of implanting dopants of the second conductivity type also forms the well region or at least partially dopes the well region.

22. The method of claim 19 wherein the step of implanting dopants of the second conductivity type is a blanket implantation step without using a mask.

23. The method of claim 19 wherein the step of insulating sidewalls of the trenches comprises forming a gate oxide on sidewalls of the trenches and a thicker gate oxide on a bottom surface of the trenches.

24. The method of claim 19 further comprising implanting dopants of the first conductivity type into the drift regions to form an enhanced drift region area below the first trench portions, the enhanced drift region area being of the first conductivity type and having a dopant concentration higher than a dopant concentration of the drift region below the second trench portions.

25. The method of claim 19 wherein the source electrode extends below a top surface of the source region.

26. The method of claim 19 wherein the trench gates are substantially linear, are parallel to each other, and are electrically connected together.

27. The method of claim 26 wherein the trench gates have their first trench gate portion being aligned with the first trench gate portion in other trench gates, and have their second trench gate portion being aligned with the second trench gate portion in the other trench gates.

\* \* \* \* \*